(12) United States Patent
Shimofuku et al.

(10) Patent No.: US 9,634,230 B2
(45) Date of Patent: Apr. 25, 2017

(54) FABRICATION METHOD OF ELECTROMECHANICAL TRANSDUCER FILM, ELECTROMECHANICAL TRANSDUCER ELEMENT, LIQUID EJECTION HEAD, AND INKJET RECORDING APPARATUS

(71) Applicants: Akira Shimofuku, Kanagawa (JP); Osamu Machida, Kanagawa (JP); Atsushi Takeuchi, Kanagawa (JP)

(72) Inventors: Akira Shimofuku, Kanagawa (JP); Osamu Machida, Kanagawa (JP); Atsushi Takeuchi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/554,568

(22) Filed: Nov. 26, 2014

(65) Prior Publication Data
US 2015/0145924 A1 May 28, 2015

(30) Foreign Application Priority Data

Nov. 28, 2013 (JP) ................................. 2013-246509

(51) Int. Cl.
*H01L 41/08* (2006.01)
*G01B 11/14* (2006.01)
(Continued)

(52) U.S. Cl.
CPC ............ *H01L 41/0805* (2013.01); *B41J 2/14* (2013.01); *B41J 2/161* (2013.01); *B41J 2/1634* (2013.01);
(Continued)

(58) Field of Classification Search
CPC . H01L 41/00; B41J 2/00; G01B 11/14; H05K 3/00; H01J 23/00
See application file for complete search history.

(56) References Cited

U.S. PATENT DOCUMENTS 4,452,526 A * 6/1984 Johannsmeier ....... G03F 9/7069
355/43
7,279,823 B2 10/2007 Higuchi et al.
(Continued)

FOREIGN PATENT DOCUMENTS

JP          04-168277      6/1992
JP        2004-319897    11/2004
(Continued)

*Primary Examiner* — David Turocy
*Assistant Examiner* — Mohammad Mayy
(74) *Attorney, Agent, or Firm* — Oblon, McClelland, Maier & Neustadt, L.L.P.

(57) ABSTRACT

Disclosed is a method of fabricating an electromechanical transducer film. The method includes treating a surface of a first electrode to be liquid-repellent, the first electrode being formed on one surface of a substrate, irradiating the surface of the first liquid-repellent electrode with an energy ray while moving an irradiation position in accordance with a shape of the electromechanical transducer film to be formed and a shape of an alignment mark to be formed, and forming the alignment mark by applying an application liquid to an area including a portion irradiated with the energy ray in accordance with the shape of the alignment mark in the irradiating step, the application liquid being applied by an inkjet method.

9 Claims, 18 Drawing Sheets

(51) Int. Cl.
*B41J 2/14* (2006.01)
*H01L 41/09* (2006.01)
*B41J 2/16* (2006.01)
*H01L 41/318* (2013.01)

(52) U.S. Cl.
CPC ............. *B41J 2/1645* (2013.01); *G01B 11/14* (2013.01); *H01L 41/081* (2013.01); *H01L 41/0973* (2013.01); *H01L 41/318* (2013.01); *B41J 2202/03* (2013.01)

(56) References Cited

U.S. PATENT DOCUMENTS

| | | | | |
|---|---|---|---|---|
| 2002/0027300 A1* | 3/2002 | Hartmann | ........ | B29D 11/00365 264/1.1 |
| 2007/0099396 A1* | 5/2007 | Hirai | .................... | H05K 1/0269 438/460 |
| 2011/0175967 A1* | 7/2011 | Machida | ............. | B41J 2/14233 347/54 |
| 2012/0026249 A1* | 2/2012 | Kihira et al. | .................. | 347/68 |
| 2012/0038712 A1* | 2/2012 | Akiyama et al. | ............... | 347/54 |
| 2013/0162726 A1* | 6/2013 | Mizukami | ............ | B41J 2/14233 347/70 |

FOREIGN PATENT DOCUMENTS

| | | |
|---|---|---|
| JP | 2005-093799 | 4/2005 |
| JP | 4432776 | 3/2010 |
| JP | 2012-210594 | 11/2012 |
| JP | 2013-063371 | 4/2013 |
| JP | 2013-115192 | 6/2013 |

\* cited by examiner

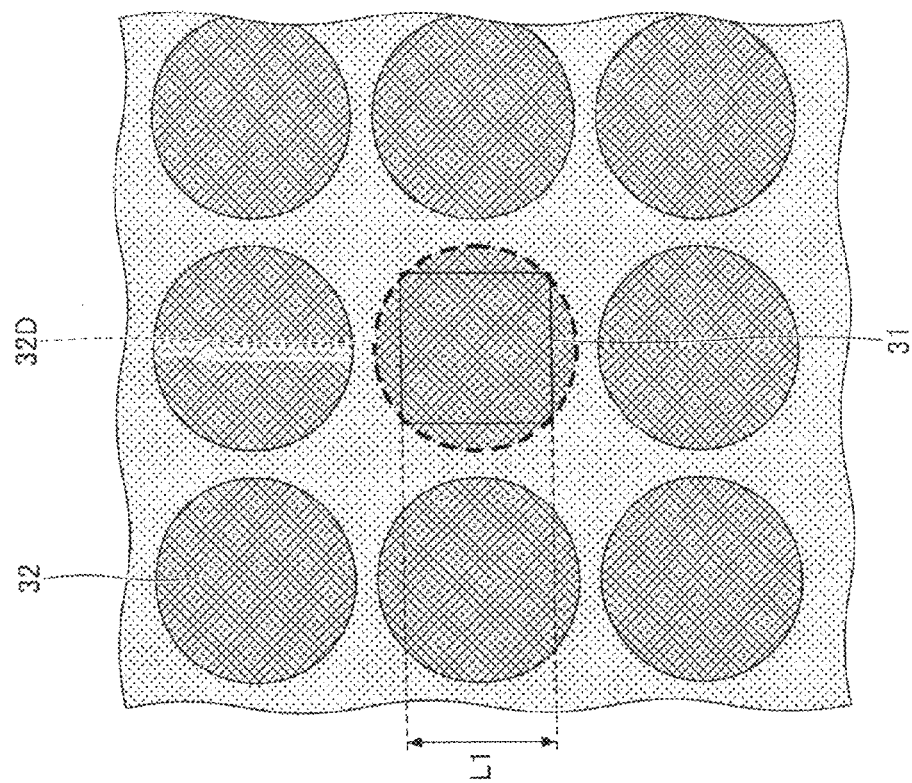
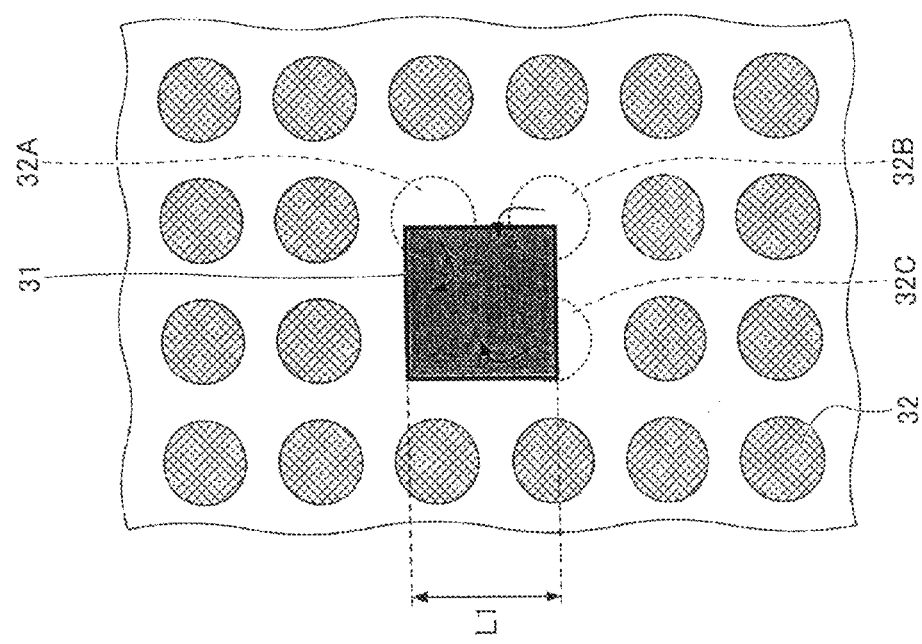

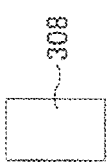
FIG.18A
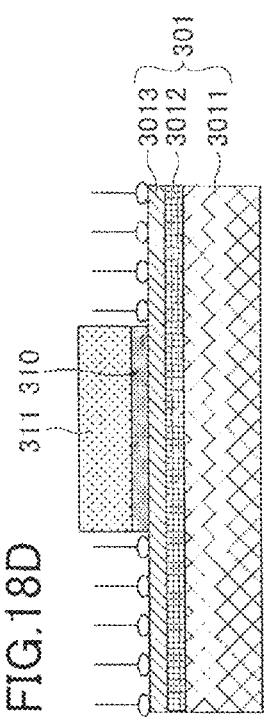
FIG.18C
FIG.18E
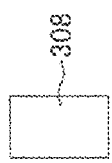
FIG.18B
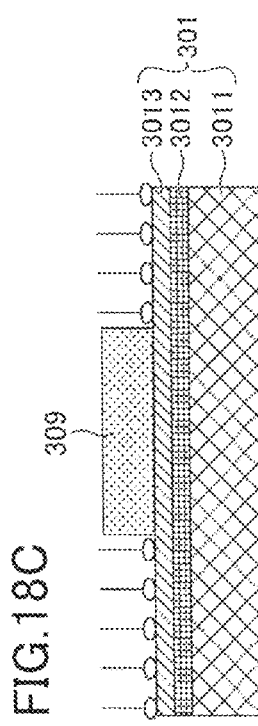
FIG.18D
FIG.18F

FABRICATION METHOD OF ELECTROMECHANICAL TRANSDUCER FILM, ELECTROMECHANICAL TRANSDUCER ELEMENT, LIQUID EJECTION HEAD, AND INKJET RECORDING APPARATUS

BACKGROUND OF THE INVENTION

1. Field of the Invention

The disclosures discussed herein relate to a fabrication method of an electromechanical transducer film, an electromechanical transducer element, a liquid ejection head, and an inkjet recording apparatus.

2. Description of the Related Art

Electromechanical transducer elements in general have a layered structure having an electromechanical transducer film disposed between electrodes.

There is known in the art an example of a method of depositing an electromechanical transducer film that includes forming a liquid-repellent film having lyophilic openings in accordance with an electromechanical transducer pattern, and supplying a sol-gel liquid serving as a raw material of the electromechanical transducer film into the lyophilic openings.

Further, an inkjet method has attracted attention as a method of supplying a sol-gel liquid into lyophilic openings of the liquid-repellent film because the inkjet method is capable of selectively supplying a sol-gel liquid into the lyophilic openings of the liquid-repellent film and is also capable of reducing unproductive usage of materials or disadvantageous effects on environmental burdens.

However, the liquid-repellent film is generally transparent. Hence, when a sol-gel liquid is supplied into the lyophilic openings of the liquid-repellent film by the inkjet method, it may be necessary to form an alignment mark in a portion of the liquid-repellent film so as to allow the alignment mark to serve as a reference point for detecting the portion where the lyophilic openings are formed.

Patent Document 1, for example, discloses a method of forming a thin film pattern that includes a liquid-repellent treatment step to provide a substrate with liquid-repellency, a lyophilic pattern forming step to initially dispose a metallic mask on the liquid-repellent substrate and to form a lyophilic part for a thin film pattern and a lyophilic part for an alignment mark on the metallically masked liquid-repellent substrate, an alignment mark forming step to form an alignment mark in the lyophilic part for the alignment mark by screen printing, and a functional fluid disposing step to dispose a functional fluid in the lyophilic part for the thin film pattern by a liquid ejection method based on the alignment mark.

However, the method disclosed in Patent Document 1 may require a metallic mask provided with openings having the same shape as a shape of the lyophilic part when the lyophilic part for the thin film pattern and the lyophilic part for the alignment mark are formed in a part of the liquid-repellently treated substrate. Hence, the thin film pattern is limited to the pattern of the metallic mask to be formed, which does not allow an immediate design change. Further, the disclosed method also may increase the number of materials because the metallic mask needs to be separately prepared. In addition, the disclosed method employs screen printing in the alignment mark forming step that differs from the method of forming the thin film pattern, which may increase complexity of the steps of the method.

RELATED ART DOCUMENT

Patent Document

Patent Document 1: Japanese Laid-open Patent Publication No. 2005-93799

SUMMARY OF THE INVENTION

Accordingly, it is a general object in one embodiment of the present invention to provide a fabrication method capable of fabricating the electromechanical transducer film and the alignment mark in a simpler and more convenient manner that substantially obviates one or more problems caused by the limitations and disadvantages of the related art.

In one aspect of the embodiment, there is provided a method of fabricating an electromechanical transducer film. The method includes treating a surface of a first electrode to be liquid-repellent, the first electrode being formed on one surface of a substrate; irradiating the surface of the first liquid-repellent electrode with an energy ray while moving an irradiation position in accordance with a shape of the electromechanical transducer film to be formed and a shape of an alignment mark to be formed; and forming the alignment mark by applying an application liquid to an area including a portion irradiated with the energy ray in accordance with the shape of the alignment mark in the irradiating step, the application liquid being applied by an inkjet method.

Other objects, features and advantages of the present invention will become more apparent from the following detailed description when read in conjunction with the accompanying drawings.

BRIEF DESCRIPTION OF THE DRAWINGS

FIGS. 3A and 3B are explanatory diagrams illustrating a relationship between an alignment mark portion and a landed droplet diameter of an application liquid in the first embodiment;

FIGS. 18A to 18F are explanatory diagrams illustrating fabrication steps in Examples 1 and 3;

DETAILED DESCRIPTION OF THE PREFERRED EMBODIMENTS

Figure 1:
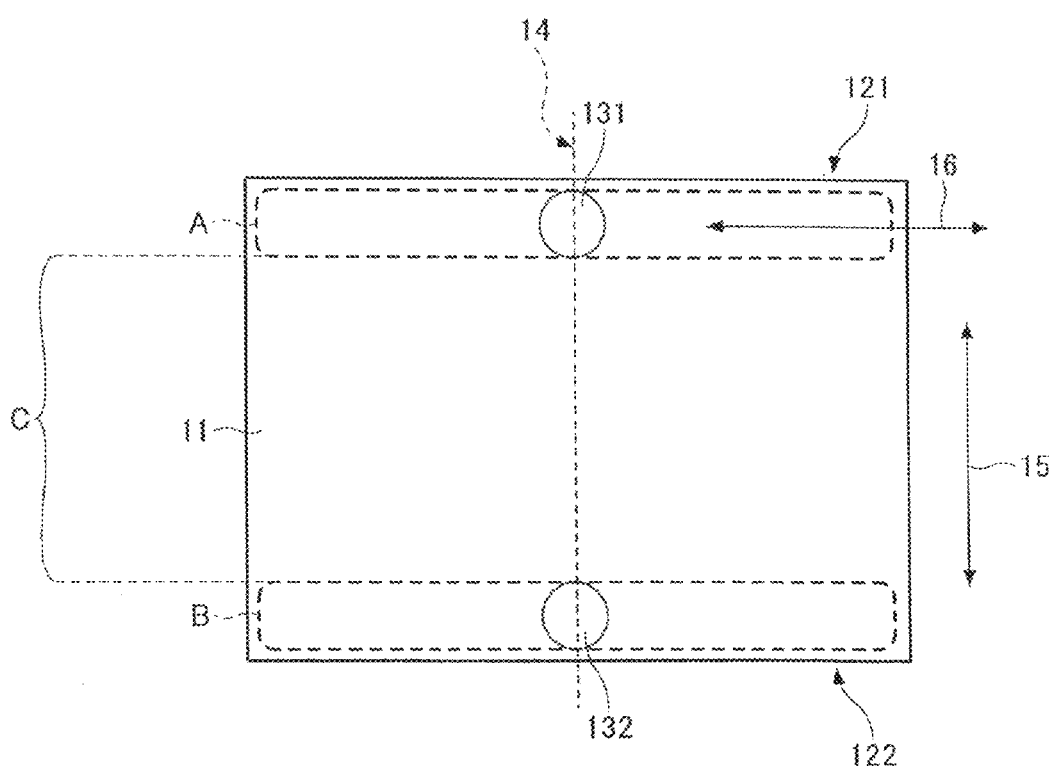
FIG. 1 is an explanatory diagram illustrating a configuration example of a position of forming an alignment mark in a first embodiment.

In the following, a description is given of embodiments with reference to accompanying drawings; however, the invention is not limited to these embodiments.
First Embodiment In a first embodiment, an illustration is given of a configuration example of a fabrication method of an electromechanical transducer film.

It is preferable that a fabrication method of an electromechanical transducer film in the first embodiment include the following steps.

A liquid-repellent treatment step to provide a surface of a first electrode with liquid-repellency. Note that the first electrode is formed on one surface of a substrate.

An energy ray irradiation step to irradiate the liquid-repellent surface of the first electrode with an energy ray while moving an irradiation position in accordance with a shape of an electromechanical transducer film to be formed and a shape of an alignment mark to be formed.

An alignment mark forming step to form the alignment mark by applying an application liquid to an area including a portion irradiated with the energy ray in accordance with the shape of the alignment mark in the energy ray irradiation step. Note that the application liquid is applied by an inkjet method.

An electromechanical transducer element generally has a layered structure having a first electrode serving as a lower electrode, and a piezoelectric film serving as an electromechanical transducer film and a second electrode serving as an upper electrode layered on the first electrode. The electromechanical transducer film and the alignment mark may simply be formed by a fabrication method of the electromechanical transducer film that includes the above-described steps. In the following, each of the fabrication steps is illustrated.

Initially, the liquid-repellent treatment step is illustrated.

In the liquid-repellent treatment step, a substrate (hereinafter also called a "base substrate") on one surface of which a first electrode is formed is used.

The substrate used in the liquid-repellent treatment step is not particularly specified, and any substrate may be used insofar as the substrate may serve as a base of the electromechanical transducer film. It is particularly preferable that the substrate to be used be formed of a material that may be easily handled in order to facilitate, after the electromechanical transducer film is formed, the treatment of the substrate to form various types of members. Thus, a silicon substrate may, for example, be preferably used.

The first electrode serves as a lower electrode for forming an electromechanical transducer element. Thus, the first electrode to be used is not particularly specified, and any electrode may be selected in accordance with performance and the like required for forming the electromechanical transducer element. Examples of a material of the first electrode may preferably include noble metal such as Au, Ag, Pt, and Cu, or oxides of the noble metal. Note that the first electrode is not necessarily formed of one layer, and may be formed of two or more layers. Further, a base layer or the like may be disposed between the first electrode and the substrate so as to enhance adhesiveness between the first electrode and the substrate or crystallization of the electromechanical transducer film.

A method of forming the first electrode is not particularly specified. However, the first electrode may, for example, be formed by general deposition such as sputtering.

Further, in the liquid-repellent treatment step, a surface of the first electrode may be provided with liquid-repellency.

In a case where two or more electromechanical transducer elements are formed on the same substrate, it is preferable that each of the electromechanical transducer elements be separately provided with a corresponding one of the electromechanical transducer films.

Thus, it is preferable that a predetermined area of the base substrate be liquid-repellent to match a layout of each of the electromechanical transducer elements so as to control wettability (applicability) of so-gel liquid inside and outside the desired electromechanical transducer film forming area. Note that it is also preferable to control the wettability (applicability) of the application liquid inside and outside the alignment mark forming area. Providing the predetermined area of the base substrate with liquid-repellency may facilitate a direct patterning fabrication method for separately applying a sol-gel liquid and the like by an inkjet method. Then, the predetermined area of the base substrate may be provided with liquid-repellency by conducting the liquid-repellent treatment step and the energy ray irradiation step.

Specific operations performed in the liquid-repellent treatment step are not particularly specified. However, it may, for example, be preferable that the surface of the first electrode be treated with a material that may be easily removable when the material is irradiated with an energy ray in the energy ray irradiation step.

For example, the liquid-repellent treatment may be conducted by dipping the base substrate into an alkanethiol liquid to form a self-assemble monolayer (SAM) film over an entire surface of the first electrode. In this case, the alkanethiol to be used is not particularly specified. However, it may, for example, be preferable that alkanethiol include molecules having a carbon chain length of C6 to C18. Further, it is preferable that a solution obtained by dissolving alkanethiol into a general organic solvent such as such as alcohol, acetones, and toluenes be used as a SAM material, that is, the alkanethiol liquid. Note that the SAM film is easily formed on platinum. Hence, when the liquid-repellent treatment is conducted by using the SAM film, it may be preferable that the first electrode be formed of platinum, or a platinum film be formed on an outermost surface of the first electrode.

Next, the energy ray irradiation step is illustrated. The energy ray irradiation step includes irradiating the liquid-repellent surface of the first electrode obtained in the liquid-repellent treatment step with an energy ray while moving an irradiation position in accordance with a shape of an electromechanical transducer film to be formed and a shape of an alignment mark to be formed.

A type of the energy ray to be used is not particularly specified. However, any type of the energy ray may be selected based on a type of the liquid-repellent material used for treating the surface of the first electrode in the liquid-repellent treatment step. For example, it may be preferable to use an energy ray capable of removing the liquid-repellent film formed on the surface of the first electrode, and capable of being emitted with high precision.

An example of the energy ray may preferably include excimer laser light such as deep UV light having a wavelength range of 300 nm or less, KrF (a wavelength of 248 nm), ArF (a wavelength of 193 nm), and F2 (a wavelength of 157 nm). Those types of excimer laser light are preferable because a thin film pattern may be formed with high precision using the excimer laser light of the types.

The SAM film formed on the surface of the first electrode may be removed, for example, by irradiating the liquid-repellent surface of the first electrode with an energy ray, and as a result, a portion of the surface of the first electrode from which the SAM film is removed becomes lyophilic. As described above, the surface of the first electrode formed on the base substrate includes the portion irradiated with the energy ray being lyophilic and the other remaining portion being liquid-repellent. Accordingly, only a desired pattern area of the surface of the first electrode may be made to be lyophilic by irradiating the surface of the first electrode with an energy ray while moving (scanning) an irradiation position of the energy ray in accordance with a shape of the electromechanical transducer film to be formed and a shape of an alignment mark to be formed.

When the surface of the first electrode is irradiated with the energy ray, it is preferable that a pattern portion corresponding to the electromechanical transducer film be a lyophilic area. The pattern portion corresponding to the electromechanical transducer film being a lyophilic area may be preferable because an electromechanical transducer liquid film is formed by supplying a sol-gel liquid in the later-described electromechanical transducer liquid film forming step.

By contrast, the alignment mark portion may be made to be lyophilic and a periphery of the alignment mark portion may be made to be liquid-repellent so as to simply identify the alignment mark. Alternatively, the alignment mark portion may be made to be liquid-repellent and the periphery of the alignment mark portion may be made to be lyophilic.

That is, in the energy ray irradiation step, the alignment mark portion is irradiated with the energy ray such that the alignment mark portion is made to be lyophilic, and the periphery of the alignment mark portion is made to be liquid-repellent. Alternatively, in the irradiating step, the periphery of the alignment mark portion is irradiated with the energy ray such that the alignment mark portion is made to be liquid-repellent, and the periphery of the alignment mark portion is made to be lyophilic.

The portion irradiated with the energy ray in the energy ray irradiation step includes a pattern corresponding to the shape of the electromechanical transducer film to be formed and the shape of the alignment mark to be formed. Accordingly, data common to an application pattern of a sol-gel liquid, such as printing data of the electromechanical transducer film pattern, which is applied by an inkjet head, may be used to identify the portion irradiated with the energy ray. The shape of the electromechanical transducer film or the shape of the alignment mark will be described later.

As described above, by making only a desired pattern portion of the surface of the first electrode to be lyophilic, separate application of the sol-gel liquid or the like may be easily performed by an inkjet method in the later-described alignment mark forming step or the electromechanical transducer liquid film forming step.

Note that in the energy ray irradiation step, a portion irradiated with the energy ray to match the shape of the electromechanical transducer film to be formed and the shape of the alignment mark to be formed may also be referred to as a "pattern portion". Specifically, a portion irradiated with the energy ray to match the shape of the electromechanical transducer film to be formed may also be referred to as an "electromechanical transducer film pattern portion".

Next, the alignment mark forming step is described. The alignment mark forming step is conducted by applying an application liquid to an area including a portion that is irradiated with the energy ray in accordance with the shape of the alignment mark in the irradiating step. Note that the application liquid is applied by an inkjet method.

After the liquid-repellent treatment step, and the energy ray irradiation step, two areas, that is, a lyophilic area and a liquid-repellent area are formed in the surface of the first electrode of the base substrate. For example, the SAM film is formed in a portion exhibiting liquid-repellency, and the first electrode is exposed from a portion exhibiting lyophilicity. However, since a liquid-repellent film such as the SAM film is generally transparent, it may be difficult to identify the lyophilic area and the liquid-repellent area by visual observation as well as by an imaging apparatus. Hence, it may be difficult to identify a portion to which a sol-gel liquid is supplied to form the electromechanical transducer film. Thus, in the alignment mark forming step, an application liquid such as a sol-gel liquid may be supplied to a portion irradiated with an energy ray in accordance with the shape of the alignment mark in the energy ray irradiation step so as to visualize the alignment mark serving as a mark or a reference point for forming the electromechanical transducer film.

In the alignment mark forming step, the application liquid such as a sol-gel liquid or a coloring liquid capable of visualizing the alignment mark may be applied by the inkjet method such that the alignment mark is identifiable. However, details of the alignment mark forming step are not particularly specified.

However, in the alignment mark forming step, the sol-gel liquid the same as that used as the application liquid for forming the electromechanical transducer film may preferably be used. This is because the use of the sol-gel liquid the same as that used as the application liquid for forming the electromechanical transducer film may reduce the number of types of the application liquid to be prepared, thereby increasing productivity.

Specifically, in the alignment mark forming step, it is preferable to supply a sol-gel liquid serving as a pre-ejecting liquid of the inkjet head to an area including a portion irradiated with the energy ray in accordance with the shape of the alignment mark.

In the inkjet method, ejecting behaviors may be unstable immediately after ejection of a liquid is started when the sol-gel liquid is applied from the inkjet head. Hence, a sol-gel liquid is generally pre-ejected to an area excluding the portion to be formed as a product in order to check or adjust a condition of the head nozzles before the sol-gel liquid is supplied to a portion to be formed as a product. The ejection of such a pre-ejected sol-gel liquid is called pre-ejection. However, the pre-ejected sol-gel liquid is not used for forming an electromechanical transducer liquid film, and thus, such pre-ejected sol-gel liquid is generally discarded.

Note that the alignment mark may simply be formed such that the alignment mark is identifiable by an imaging apparatus, and there may be no specific requirement for the variability of the film thickness or the quality of the material forming the alignment mark.

Thus, in the alignment mark forming step, it is preferable that the pre-ejection of the inkjet head be conducted by supplying a sol-gel liquid for use in the pre-ejection of the inkjet head so as to suppress waste of the sol-gel liquid.

In the alignment mark forming step, it may be sufficient that the application liquid such as a sol-gel liquid is supplied to a portion irradiated with an energy ray in accordance with the shape of the alignment mark. However, the liquid-repellent film is generally transparent, and accurate detection of the position of the portion irradiated with the energy ray in accordance with the alignment mark in this alignment mark forming step appears to be difficult. Accordingly, in the alignment mark forming step, it is preferable that the application liquid such as a sol-gel liquid be supplied to a certain area including the portion irradiated with energy ray in accordance with the shape of the alignment mark so as to reliably visualize the alignment mark. Further, when the pre-ejection is performed as described above, it is preferable to appropriately conduct the pre-ejection by causing all the nozzles to pre-eject the application liquid with respect to a certain sol-gel liquid supply area (a pre-ejection area).

Note that an illustration is given of the shape of the alignment mark or the area to which the application liquid such as a sol-gel liquid is supplied in the alignment mark step.

The number of alignment marks and positions of the alignment marks to be formed are not particularly specified. However, since the area in which the electromechanical transducer film is to be formed may be determined as large as possible, it is preferable to form alignment marks 131 and 132 at respective positions close to two mutually facing sides 121 and 122 of the substrate 11 serving as two ends of the substrate 11. In this case, it is preferable that a straight line 14 connecting between the two alignment marks be parallel with a scanning direction 15 of the substrate as well as being perpendicular to a main scanning direction 16 of the inkjet head. In addition, it is preferable that each of the alignment marks 131 and 132 be formed approximately in the middle of a corresponding one of the sides 121 and 122, and be formed in the middle of each of the later-described approximately rectangular supply areas to which the sol-gel liquid or the like is supplied.

In the substrate 11, it is preferable that each of the two sides 121 and 122 indicated by A and B in FIG. 1 serve as one side of an approximately rectangular area including a corresponding one of the alignment marks 131 and 132, which is an area to which the application liquid such as a sol-gel liquid or the like is supplied (hereinafter also referred to as a "sol-gel liquid supply area"). In the alignment mark forming step, it is preferable that the application liquid such as a sol-gel liquid be supplied to an entire area of each of the sol-gel liquid supply areas as described above.

In general, an inkjet apparatus provided with an inkjet head is configured to scan a substrate in one axis direction, and cause the inkjet head including plural nozzles to scan in an axis direction (a main scanning direction) perpendicular to the scanning direction of the substrate so as to supply a liquid to a desired position. Further, the plural nozzles of the inkjet head are, in general, aligned in parallel with the main scanning direction of the inkjet head.

Then, as described above, in the alignment mark forming step, it is preferable that all the nozzles disposed in the inkjet head conduct pre-ejection. Hence, in the alignment mark forming step, it is preferable, in view of productivity, that all the nozzles be driven once to allow the nozzles to pass through the sol-gel supply areas to conduct the pre-ejection when the inkjet head is driven in the main scanning direction.

Thus, it is preferable that the above-described relationship be satisfied between the alignment marks and the sol-gel liquid supply areas including the respective alignment marks, and between the scanning directions of the substrate and the inkjet head.

An area C sandwiched between the sol-gel liquid supply areas A and B is determined to be an electromechanical transducer film pattern portion forming area, and plural electromechanical transducer film patterns may be formed in the electromechanical transducer film pattern portion forming area.

In this embodiment, the substrate is illustrated as a rectangular shape for convenience; however, the shape of the substrate is not limited to the rectangular shape. For example, as illustrated in FIG. 2A, in a case where the substrate is approximately circular, two facing chords 25 and 26 may serve as the above-described two sides 121 and 122 of the substrate 11. Then, each of the rectangular areas A and B having a corresponding one of the chords 25 and 26 as one side is made to serve as a sol-gel supply area. Hence, not-illustrated alignment marks may be formed in the respective sol-gel supply areas. Then, an area sandwiched between the rectangular areas A and B may be made to be an electromechanical transducer film pattern forming area C in which plural electromechanical transducer film pattern portion arrays 23 are formed.

Figure 2B:
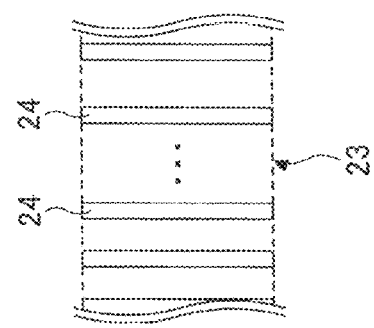
FIGS. 2A and 2B are explanatory diagrams illustrating a configuration example of a position at which the alignment mark is formed in the first embodiment.
Figure 2A:
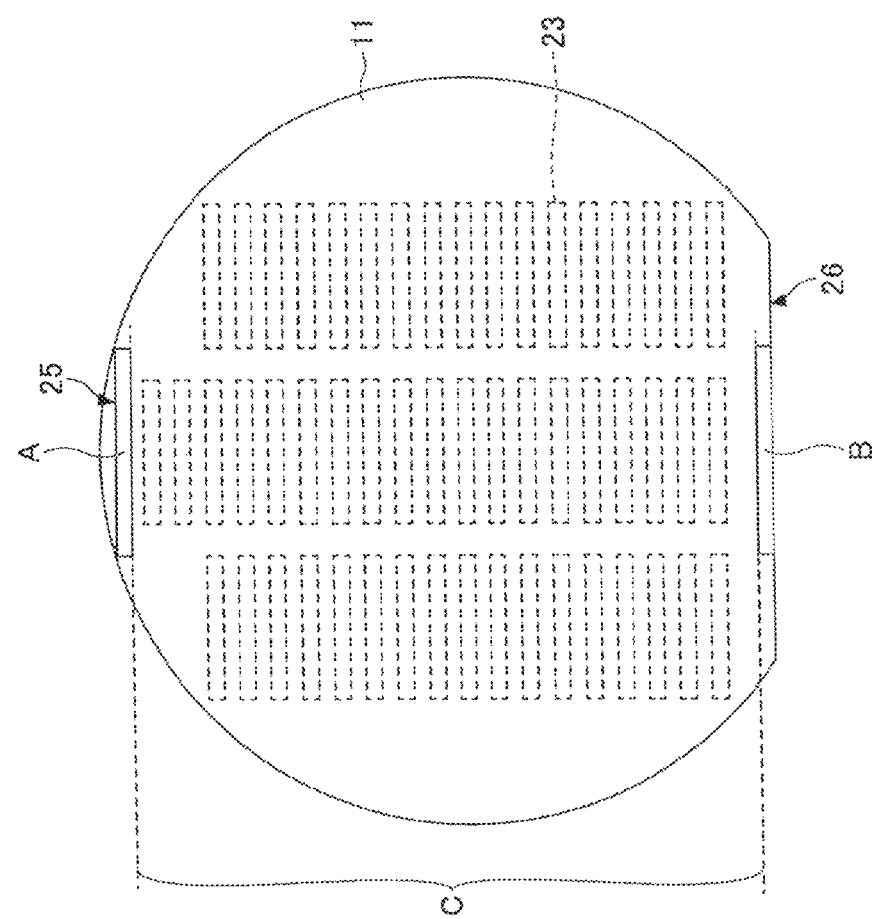

Each of the electromechanical transducer film pattern portion arrays 23 may include plural electromechanical transducer film pattern portions 24 as illustrated in FIG. 2B. The shape of the electromechanical transducer film pattern portion 24 may be rectangular as illustrated in FIG. 2B. However, the electromechanical transducer film pattern portion 24 is not limited to the rectangular shape, and may have any shape based on a shape required for the electromechanical transducer film.

Next, a shape of the alignment mark is illustrated. Line components shaping and forming the alignment mark may be liner or curved. However, it is preferable that an entire size of the alignment mark fall within a field of view of an imaging apparatus disposed for detecting the alignment mark.

Further, it is preferable that a short side of the alignment mark or a diameter of the circular alignment mark be longer than a landed diameter of a liquid droplet of the application liquid such as a sol-gel liquid applied by the inkjet method.

As described above, in the fabrication method of the electromechanical transducer film, after the first electrode surface is provided with liquid-repellency, the energy ray irradiation step is performed so as to form a lyophilic area and a liquid-repellent area. Thereafter, the application liquid such as a sol-gel liquid may be supplied by the inkjet method to an area including a portion irradiated with the energy ray in accordance with the shape of the alignment mark, that is, a sol-gel liquid supply area, for example.

Liquid droplets landed in the sol-gel supply area in this case are illustrated with reference to FIGS. 3A and 3B, and FIGS. 4A and 4B. Each of FIGS. 3A and 3B, and FIGS. 4A and 4B illustrates an example of an enlarged part of the sol-gel liquid supply area. Note that in the following illustration, an alignment mark portion indicates a portion having a shape of the alignment mark.

Initially, an illustration is given, with reference to FIGS. 3A and 3B, of an example in which the alignment mark portion is irradiated with an energy ray to make the alignment mark portion to be lyophilic.

As illustrated in FIGS. 3A and 3B, a lyophilic area 31 serving as the alignment mark portion is disposed in the middle of each of the FIGS. 3A and 3B, so that a periphery of the lyophilic area 31 is liquid-repellent. In FIGS. 3A and 3B, L1 represents a length of the short side of the alignment mark portion.

Then, when the application liquid such as a sol-gel liquid is supplied by the inkjet method to the entire sol-gel liquid supply area, droplets 32 of the application liquid such as a sol-gel liquid are landed at regular intervals as illustrated in FIGS. 3A and 3B. Landed hemispherical droplets of the application liquid such as a sol-gel liquid remain unchanged with their hemispherical shapes in the liquid-repellent area, and droplets of the application liquid landed in the lyophilic area 31 spread over the entire lyophilic area 31.

In FIG. 3A, the short side of the lyophilic area 31 serving as the alignment mark portion has a length L1 longer than a diameter of the landed droplet of the ejected application liquid. In this case, droplets 32A to 32C of the application liquid landed over an edge line of the lyophilic area 31 move in directions indicted by arrows in FIG. 3A, and are attracted to the lyophilic area 31. Thus, the contrast of the edge line of the lyophilic area 31 retains clarity. Note that the edge line of the lyophilic area 31 indicates a boundary between the lyophilic area 31 and the liquid-repellent area.

By contrast, in FIG. 3B, an alignment mark having the same size and the same shape of those of the alignment mark in FIG. 3A is given; however, a short side of the lyophilic area 31 serving as the alignment mark portion has a length L1 shorter than the diameter of the landed droplet of the ejected application liquid such as a sol-gel liquid. In this case, the droplet 32D of the application liquid landed in the lyophilic area 31 may exceed the lyophilic area 31 depending on the depth of the lyophilic area 31, which does not allow the contrast of the edge line of the lyophilic area 31 to retain clarity. Further, the droplet 32D of the application liquid landed in the lyophilic area 31 may be coupled with other adjacent droplets. Hence, as illustrated in FIG. 3A, it is preferable that the short side of the alignment mark portion have a length longer than a landed diameter of the droplet of the application liquid such as a sol-gel liquid.

Figure 4B:
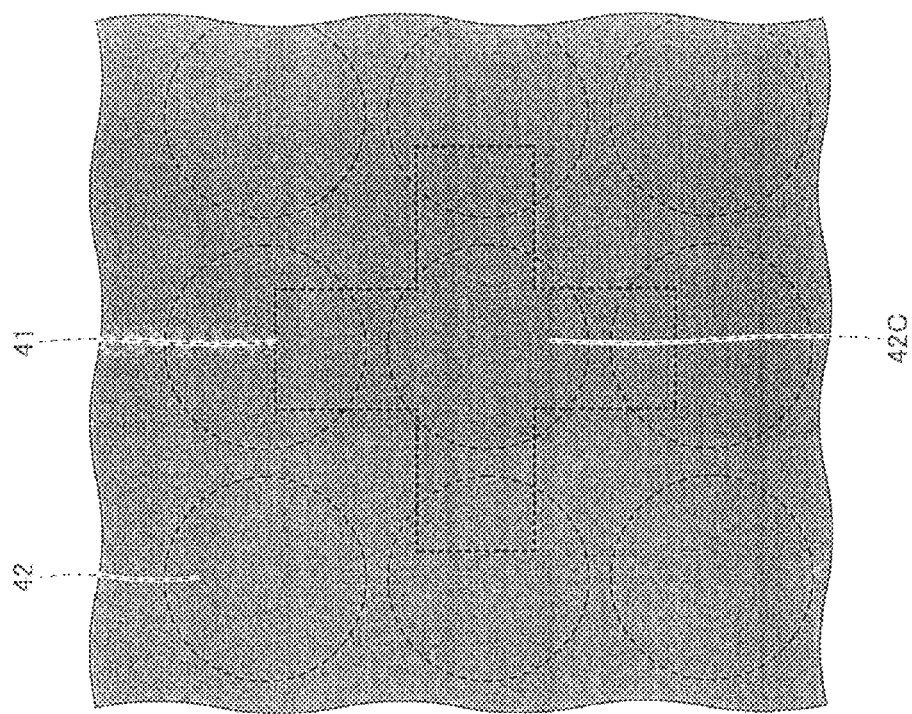
FIGS. 4A and 4B are explanatory diagrams illustrating a relationship between the alignment mark portion and the landed droplet diameter of the application liquid in the first embodiment.
Figure 4A:
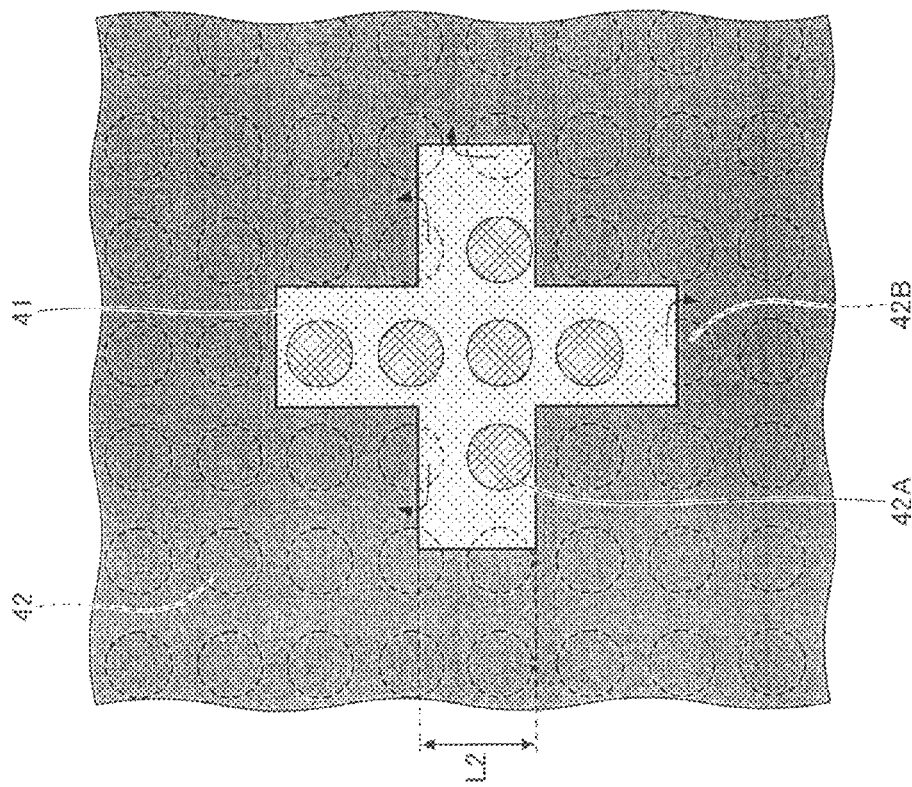

Next, an illustration is given, with reference to FIGS. 4A and 4B, of a case where a periphery of the alignment mark portion is irradiated with an energy ray to make the alignment mark portion to serve as a liquid-repellent area as well as making the periphery of the alignment mark portion to serve as a lyophilic area.

As illustrated in FIGS. 4A and 4B, a liquid-repellent area 41 serving as the alignment mark portion is disposed in the middle of each of the FIGS. 4A and 4B, so that a periphery of the liquid-repellent area 31 is lyophilic. In FIGS. 4A and 4B, L2 represents a length of the short side of the alignment mark portion.

Then, when the application liquid such as a sol-gel liquid is supplied by the inkjet method to the entire sol-gel liquid supply area, droplets 42 of the application liquid such as a sol-gel liquid are landed at regular intervals as illustrated in FIGS. 4A and 4B. Hemispherical droplets of the application liquid such as a sol-gel landed in the liquid-repellent area serving as the alignment mark portion remain unchanged with their hemispherical shapes, and the landed droplets of the application liquid spread over an entire lyophilic area 41.

In FIG. 4A, the short side of the liquid-repellent area 41 serving as the alignment mark portion has a length L2 longer than a diameter of the landed droplet of the ejected application liquid. Hence, hemispherical droplets 42A of the application liquid such as a sol-gel liquid landed in the liquid-repellent area 41 remain unchanged with their hemispherical shapes and are held within the liquid-repellent area 41. Hence, droplets 42B of the application liquid landed over an edge line of the liquid-repellent area 41 move in directions indicted by arrows in FIG. 4A, and are attracted to the lyophilic area 41. Thus, the contrast of the edge line of the liquid-repellent area 41 retains clarity. Note that the edge line of the liquid-repellent area 41 indicates a boundary between the liquid-repellent area 41 and the lyophilic area.

By contrast, in FIG. 4B, an alignment mark having the same size and the same shape of those of the alignment mark in FIG. 4A is given; however, a short side of the liquid-repellent area 41 serving as the alignment mark portion has a length L2 shorter than the diameter of the landed droplet 42 of the ejected sol-gel liquid such as a sol-gel liquid. In this case, the landed droplet 42 of the application liquid such as a so-gel liquid may fail to be retained on a surface of the liquid-repellent area 41 depending on a surface area of the liquid-repellent area 41, and the unretained droplet 42 may be coupled with the lyophilic area as illustrated in FIG. 4B. That is, the contrast of the edge line of the liquid-repellent area 41 may fail to retain clarity.

Thus, as described above, in order to more reliably and clearly visualize the alignment mark, it is preferable that the short side of the alignment mark portion or a diameter of the circle be longer than a landed diameter of the droplet of the application liquid applied by the inkjet method.

Accordingly, in the alignment mark forming step, it is preferable that a droplet size of the droplet ejected by the inkjet method or the size of the alignment mark portion be adjusted so as to satisfy the above-described requirements.

In the alignment mark forming step, an apparatus to apply the application liquid such as a sol-gel liquid is not particularly specified; however, it is preferable that the apparatus to be used be the same as that used for forming an electromechanical transducer liquid film. Specifically, it is preferable to use the same apparatus from the energy ray irradiation step to the electromechanical transducer liquid film forming step. Hence, it may be preferable to use an industrial inkjet apparatus 50 as illustrated in FIG. 5.

Figure 5:
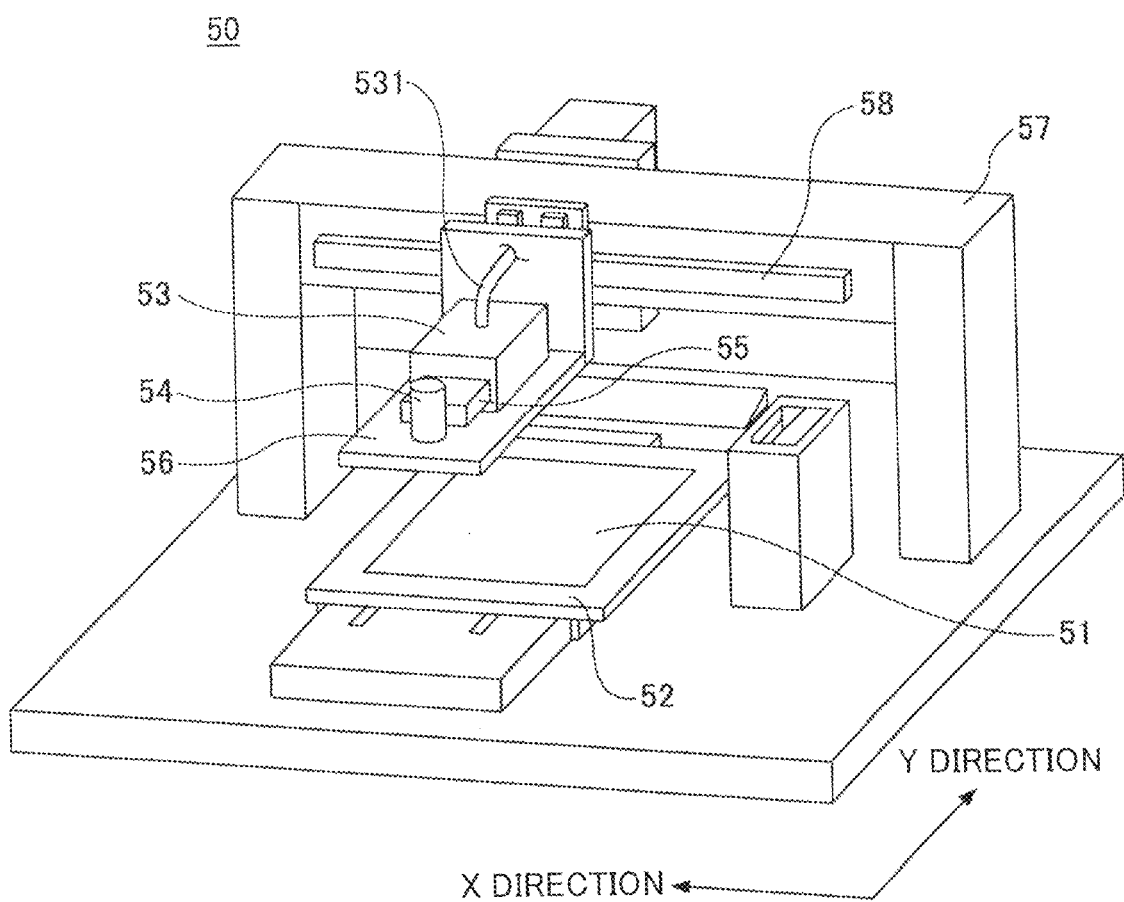
FIG. 5 is an explanatory diagram illustrating a configuration example of an industrial inkjet apparatus in the first embodiment.

The industrial inkjet apparatus 50 illustrated in FIG. 5 includes a stage 52 configured to drive a substrate 51 on the stage 52 in a Y direction. The industrial inkjet apparatus 50 further includes a head base 56 having an inkjet head 53, an imaging apparatus 54, and an energy ray irradiation device 55 such that the head base 56 faces the substrate 51 on the stage 52.

The inkjet head 53 is connected to a functional ink material supply pipe 531, and configured to receive an application liquid such as a sol-gel liquid from a not-illustrated tank, and supply the application liquid such as a sol-gel liquid to the substrate 51.

The imaging apparatus 54 is configured to image any part formed on the substrate, and may, for example, be connected to an external computer or the like to detect an alignment mark formed on the substrate 51.

Further, the energy ray irradiation device 55 is configured to oscillate an energy ray used in the energy ray irradiation step, and irradiate the substrate 51 with the energy ray.

The head base 56 includes an X-axis drive device 58 disposed on an X-axis supporting member 57 so as to move the head base 56 in an X direction. Hence, an irradiation position of the energy ray emitted by the energy ray irradiation device or landing positions of droplets of a sol-gel liquid on the substrate 51 supplied from the inkjet head 53 may be changed by the stage 52 and the X-axis drive device 58.

Thus, as described above, after visualizing the alignment mark in the alignment mark forming step, it is possible to detect print positions using the imaging apparatus. Hence, it is possible to accurately align or locate the substrate with respect to a drawing pattern, and accurately apply the sol-gel liquid when an electromechanical transducer liquid film is formed to form the electromechanical transducer liquid film having a desired shape.

The method of fabricating the electromechanical transducer film of the embodiment may further include a print position detection step, an electromechanical transducer liquid film forming step, and a heat treatment step. In the following, an illustration is given of the print position detection step, the electromechanical transducer liquid film forming step, and the heat treatment step.

The print position detection step is described first. The print position detection step is configured to detect print positions based on the alignment mark formed in the forming the alignment mark step. In the print position detection step, initially, the alignment mark formed and visualized in the alignment mark forming step is identified by the imaging apparatus. Then, a position of the electromechanical transducer film pattern portion formed in the energy ray irradiation step may be detected based on positional data of the alignment mark and print data of the electromechanical transducer film patterns. That is, a print position to which a sol-gel liquid is supplied for forming an electromechanical transducer liquid film may be detected based on the positional data of the alignment mark and the print data of the electromechanical transducer film patterns.

Next, the electromechanical transducer liquid film forming step is illustrated. The electromechanical transducer liquid film forming step is configured to apply a sol-gel liquid by an inkjet method to a portion irradiated with an energy ray in accordance with a shape of the electromechanical transducer film in the energy ray irradiation step. The electromechanical transducer liquid film is formed by conducting such an electromechanical transducer liquid film forming step.

In the electromechanical transducer liquid film forming step, a sol-gel liquid is partially applied by the inkjet method to the electromechanical transducer film pattern portion which is, by being irradiated with the energy ray, made to be lyophilic. In this step, a sol-gel liquid may be supplied based on the print position detected in the print position detection step.

As described above, an area of the first electrode to which a sol-gel liquid is applied, that is, the electromechanical transducer film pattern portion, is lyophilic. By contrast, an area of the first electrode to which the sol-gel liquid is not applied, that is, a portion excluding the electromechanical transducer film pattern portion, is liquid-repellent because a SAM film or the like is formed on the portion in the liquid-repellent treatment step. Thus, since wettability (applicability) is different inside and outside the electromechanical transducer film pattern portion, it is possible to apply the sol-gel liquid to one portion and the other portion separately with high accuracy. Accordingly, it is possible to easily form the electromechanical transducer liquid film having a desired shape.

A configuration of the sol-gel liquid applied to the electromechanical transducer film pattern portion in the electromechanical transducer liquid film forming step is not particularly specified, and any configuration may be selected based on the electromechanical transducer film to be formed.

In a case of the electromechanical transducer film used as a thin film actuator, it is preferable the electromechanical transducer film be formed of a composite metal oxide film.

Specifically, in a case where the electromechanical transducer film is PZT (lead-zirconate-titanate), lead acetate, zirconium alkoxide and titanium alkoxide that are used as starting materials are dissolved in 2-methoxyethanol that is used as a common solvent to obtain a uniform PZT so-gel liquid.

PZT is a solid solution of lead zirconate ($PbZrO_3$) and lead titanate ($PbTiO_3$), and is represented by the following chemical formula $Pb(Zr_1-xTi_x)O_3$ ($0<x<1$). However, a characteristic varies according to the ratio. In general, the composition indicating superior electrictromechanical properties has a molar ratio of $PbZrO_3$ to $PbTiO_3$ at 53:47, which is represented by the following chemical formula: $Pb(Zr_{0.53}Ti_{0.47})O_3$, and is generally represented by PZT(53/47). Hence, it is preferable that the starting materials of the lead acetate, zirconium alkoxide, titanium alkoxide be measured and mixed to obtain the stoichiometric mixture ratio of the above chemical formula.

Note that the electromechanical transducer liquid film may be heated in the later-described heat treatment step so as to function as the electromechanical transducer film. Specifically, crystallization in the heat treatment step may cause partial volatilization of Pb atoms in the coated film. That is, the crystallization in the heat treatment step may cause so-called "lead volatilization". Hence, it is preferable that the lead volatilization in the heat treatment step be assumed to prepare a composite oxide containing lead such as PZT, and an excessive amount of Pb at mass ratio of approximately 5 to 25% compared to the stoichiometry be added to the starting materials.

Further, the metal alkoxide compound is hydrolyzed by atmospheric water easily. Hence, it is preferable to add appropriate amounts of acetylacetone, acetic acid, diethanolamine, and the like as stabilizers to suppress the progress of hydrolysis.

A preferable example of a material for use in the electromechanical transducer film includes barium titanate and the like. When barium titanate is used, barium alkoxide and titanium alkoxide may be used as the starting materials, and these compounds may be dissolved into a common solvent to prepare a sol-gel liquid for barium titanate.

Note that it is preferable that the quality of the sol-gel liquid such as the viscosity and the surface tension be adjusted in order to facilitate the supply of the so-gel liquid from the inkjet head.

Further, the electromechanical transducer liquid film forming step may be conducted two or more times according to the required thickness of the electromechanical transducer film.

Next, the heat treatment step is illustrated.

After the sol-gel liquid is supplied by the inkjet method to form an electromechanical transducer liquid film, it is preferable to conduct the heat treatment step to heat the electromechanical transducer liquid film to form an electromechanical transducer film. A specific content of the heat treatment is not particularly specified; however, the heat treatment step may include a drying step to dry the so-gel liquid, a thermal decomposition step to thermally decompose an organic substance or the like contained in the sol-gel liquid, and a crystallization step to crystallize a substance composing the electromechanical transducer film. Note that it is preferable to conduct the crystallization step in order to cause the electromechanical transducer film to exhibit sufficient performance. A specific requirement of the heat treatment is not particularly specified because the requirement may differ with a type of the sol-gel liquid to be employed.

As described above, the electromechanical transducer liquid film forming step may be conducted two or more times. However, even when the electromechanical transducer film forming step is conducted two or more times, content of the heat treatment step or timing to conduct the electromechanical transducer film forming step is not particularly specified. The heat treatment step may be conducted based on any condition or timing considering the performance required for the electromechanical transducer film, the productivity, and the like.

For example, the drying step, the thermal decomposition step, and the crystallization step may be conducted in this order every time the electromechanical transducer liquid film forming step is conducted.

Alternatively, only the drying step may be conducted every time the electromechanical transducer liquid film forming step is conducted, and the thermal decomposition step may be conducted every two or more times the electromechanical transducer liquid film forming step is conducted after the drying step. Further, the crystallization step may be conducted every time the thermal decomposition step is conducted and every two or more times the electromechanical transducer film forming step is conducted after the drying step.

Note that in the inkjet method, it is preferable that the electromechanical transducer film formed in one electromechanical transducer liquid film forming step and heat treatment step have a predetermined thickness or less so as to prevent the electromechanical transducer film from cracking due to the volume shrinkage of the sol-gel film, in a manner similar to a case where the electromechanical transducer film is deposited by a spin-coating method. Specifically, the film thickness of the electromechanical transducer film deposited in one electromechanical transducer liquid film forming step and heat treatment step may preferably be 100 μm or less, and further preferably be 2 μm or less. The lower limit of the film thickness of the electromechanical transducer film deposited in one electromechanical transducer liquid film forming step and heat treatment step is not particularly specified. However, the lower limit of the film thickness of the electromechanical transducer film may preferably be 0.01 μm or more, and further preferably be 0.03 μm or more.

Note that the film thickness of the electromechanical transducer film deposited in one electromechanical transducer liquid film forming step and heat treatment step may be adjusted based on the concentration (solid content) of the sol-gel liquid, the supplied amount of the sol-gel liquid, or the like.

As described above, when the electromechanical transducer liquid film forming step is conducted two or more times, it is preferable that a portion forming the electromechanical transducer film be a lyophilic area and a portion excluding the electromechanical transducer film forming portion be a liquid-repellent area, from the second time onward. Thus, the lyophilic area and the liquid-repellent area may be formed in the surface of the substrate in a manner similar to a case when the electromechanical transducer film is formed on the substrate at the first time; however, the formation of the lyophilic area and the liquid-repellent area may be simplified as described below.

As described above, when the electromechanical transducer film is formed at the first time, the lyophilic area is formed corresponding to a portion forming the electromechanical transducer film and the alignment mark on the substrate by conducting the liquid-repellent treatment step and the energy ray irradiation step. However, when a SAM film is, for example, used as a liquid-repellent film, the SAM film is unable to be formed on an oxide thin film. Hence, in the surface treatment of the substrate from the second time onward, the SAM film is formed only on the exposed first electrode on which the electromechanical transducer film is not formed. Hence, the electromechanical transducer film pattern portion may be made as the lyophilic area and the other portion may be made as the liquid-repellent area by dipping the substrate into an alkanethiol liquid, that is, by performing the liquid-repellent treatment step, and the energy ray irradiation step may be omitted.

In addition, not only does the electromechanical transducer film on the substrate become solidified but the alignment mark on the substrate is also solidified by conducting the heat treatment step after the first electromechanical transducer liquid film forming step. Thus, the shape of the alignment mark is retained, and there is no need of conducting the alignment mark forming step from the second time onward.

The already formed alignment mark may be used for detecting the print position, and hence, the alignment may be conducted in a manner similar to that conducted in the first print position detection step.

Hence, it is preferable that the alignment mark forming step be conducted before the first electromechanical transducer liquid film forming step is conducted. Note that the alignment mark forming step may similarly be conducted from the second time onward.

Further, the alignment mark forming step may be conducted once only. Thus, the pre-ejection for the sol-gel liquid application by the inkjet method may be conducted in the sol-gel supply area of the substrate at least at the first application of the sol-gel liquid (serving as the application liquid), and the pre-ejection from the second time onward may conducted outside the surface of the substrate.

When the electromechanical transducer liquid film forming step is conducted two or more times as described above, the portion of the substrate excluding the electromechanical transducer film pattern portion may partially be made to be liquid-repellent only by dipping the substrate heated after the electromechanical transducer liquid film forming step at the first time. Hence, the electromechanical transducer liquid film forming step may be conducted by the inkjet method immediately thereafter. Further, the heat treatment step may optionally be conducted after the electromechanical transducer liquid film forming step as described above.

Then, the electromechanical transducer film having a desired shape and thickness may be formed by repeatedly conducting the electromechanical transducer liquid film forming step and the heat treatment step. The film thickness of the electromechanical transducer film formed in the above is not particularly specified, and may be defined based on the application and the productivity. For example, the range of the film thickness of the electromechanical transducer film is not particularly specified for use in the electromechanical transducer element that is used as a liquid ejection head. However, the preferable thickness of the electromechanical transducer film may be 1 μm or more to 20 μm or less, and the specifically preferable thickness of the electromechanical transducer film may be 2 μm or more to 10 μm or less in order to exhibit sufficient performance.

Further, it is possible to form the electromechanical transducer element by forming the second electrode (i.e., the upper electrode) on the electromechanical transducer film obtained by the fabrication method of the above-described electromechanical transducer film. The material and the film thickness of the second electrode are not particularly specified. For example, the second electrode may have the configuration similar to that of the first electrode, and may be formed on the upper surface of the electromechanical transducer film. Note that the second electrode may be a discrete electrode. Hence, the second electrode may optionally be etched so as to pattern an individual electrode.

According to the above-described fabrication method of the electromechanical transducer film of the first embodiment, the electromechanical transducer film and the alignment mark may be formed in a simpler and more convenient manner compared to the related art fabrication method. Further, the alignment mark and the electromechanical transducer liquid film may be formed by the inkjet method, and the alignment mark and the electromechanical transducer liquid film are formed continuously by the same apparatus. Thus, the electromechanical transducer liquid film and the alignment mark may be formed by a simpler and more convenient fabrication method to increase the productivity.

Further, the electromechanical element of the first embodiment has the electromechanical transducer film having a desired and appropriate shape. Thus, the electromechanical element of the first embodiment may be able to exhibit high piezoelectricity.

Second Embodiment

A second embodiment illustrates a liquid ejection head that is provided with the electromechanical transducer element illustrated in the first embodiment.

Figure 6:
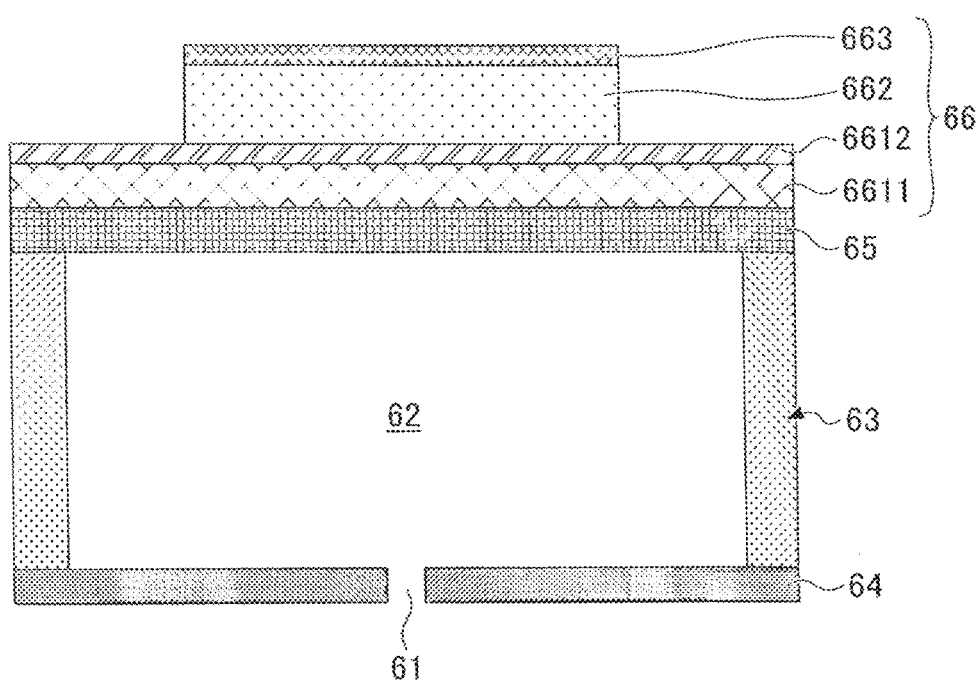
FIG. 6 is an explanatory diagram illustrating a configuration example of a liquid ejection head in a second embodiment.

As illustrated in FIG. 6, a specific configuration of a liquid ejection head 60 of the second embodiment may include a nozzle 61 configured to eject liquid, a compression chamber 62 in communication with the nozzle 61, and an ejection drive device configured to pressurize liquid inside the compression chamber 62.

In such a liquid ejection head 60, the compression chamber 62 is formed by etching from a rear side of a substrate 63 on which the electromechanical transducer film of the first embodiment is formed, and a nozzle plate 64 having nozzle a nozzle hole is attached to the compression chamber 62.

Then, a diaphragm 65 serving as the ejection drive device is formed of a part of the compression chamber 62, an electromechanical transducer element 66 having an electromechanical transducer film 662 illustrated in the first embodiment is disposed on the diaphragm 65. The electromechanical transducer element 66 may, as illustrated above, be configured to include a first electrode (a lower electrode), the electromechanical transducer film 662, and a second electrode 663. FIG. 6 illustrates an example of the first electrode that is configured to include an oxide electrode 6611, and a platinum electrode 6612. However, the configuration of the first electrode is not limited to this example.

Figure 7:
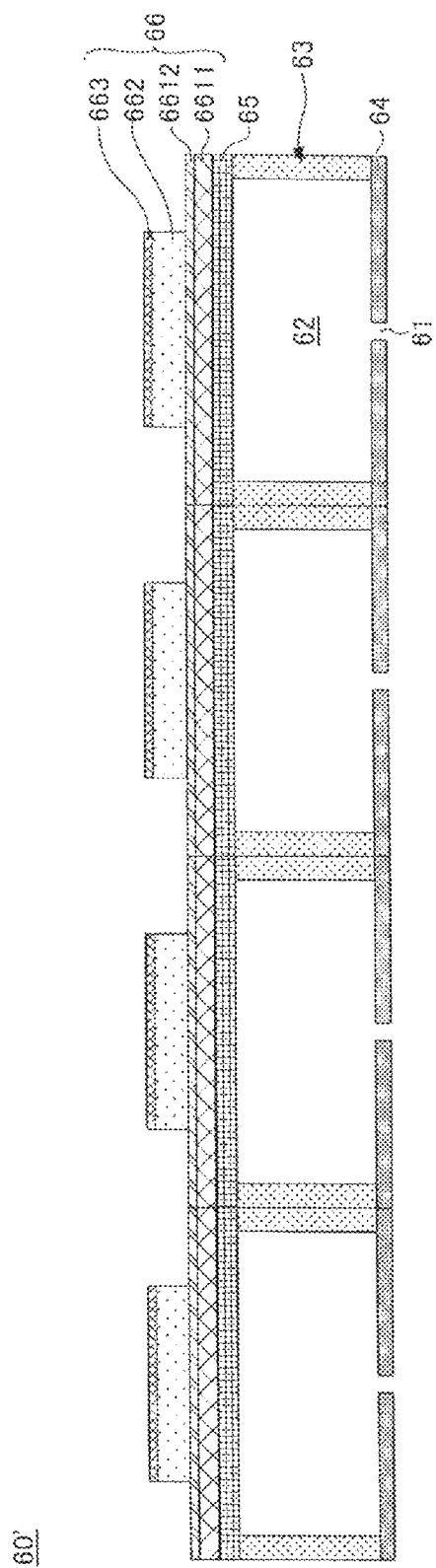
FIG. 7 is an explanatory diagram illustrating a configuration example of a liquid ejection head in the second embodiment.

Note that the second embodiment illustrates the liquid ejection head formed of one nozzle. However, the configuration of the liquid ejection head is not limited to this example. The liquid ejection head may be formed of plural liquid ejection heads, as illustrated in FIG. 7. The liquid ejection head 60' in FIG. 7 is configured to include linearly displosed plural liquid ejection heads 60 in FIG. 6, the same components of which are provided with the same numbers.

Further, an illustration of a liquid supply device, a channel, fluid resistance part, and the like are omitted from the specification; however, the liquid ejection head 60' may include those utility components that may be provided with the liquid ejection head.

The liquid ejection head of the second embodiment employs the electromechanical transducer film fabricated by the fabrication method of the electromechanical transducer film, and the electromechanical transducer element having the electromechanical transducer film illustrated in the first embodiment. Since the electromechanical transducer film of the first embodiment is fabricated by the simpler and more convenient fabrication method as illustrated in the first embodiment, it is possible to fabricate the liquid ejection head of the second embodiment in a manner similar to the first embodiment. Further, since the electromechanical transducer film may be formed with high precision, the liquid ejection head of the second embodiment may be able to exhibit stable liquid ejection performance.

Third Embodiment

A third embodiment illustrates a liquid ejection apparatus that is provided with the liquid ejection head illustrated in the second embodiment. A configuration of the liquid ejection apparatus is not particularly specified; however, an inkjet recording apparatus may be given as an example of the liquid ejection apparatus. Note that in the following, the inkjet recording apparatus may also simply be referred to as a "recording apparatus".

Figure 8:
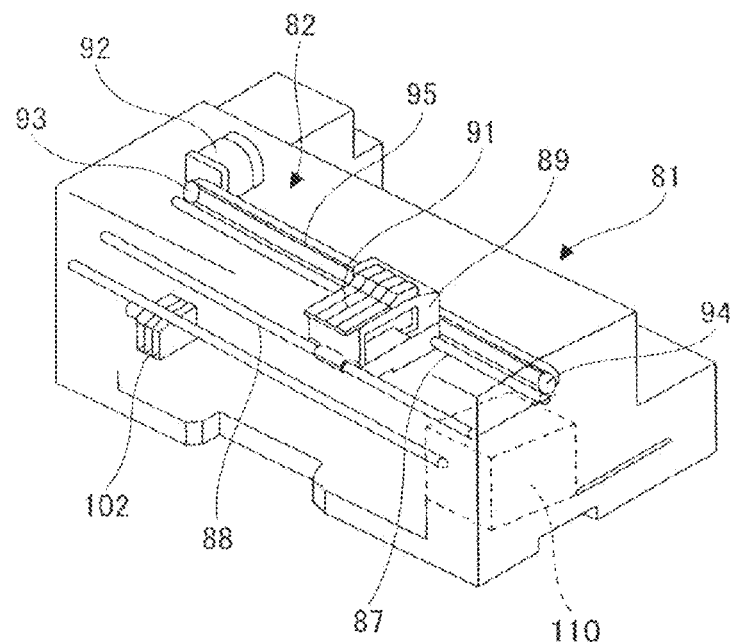
FIG. 8 is an explanatory perspective diagram illustrating an inkjet recording apparatus in a third embodiment.
Figure 9:
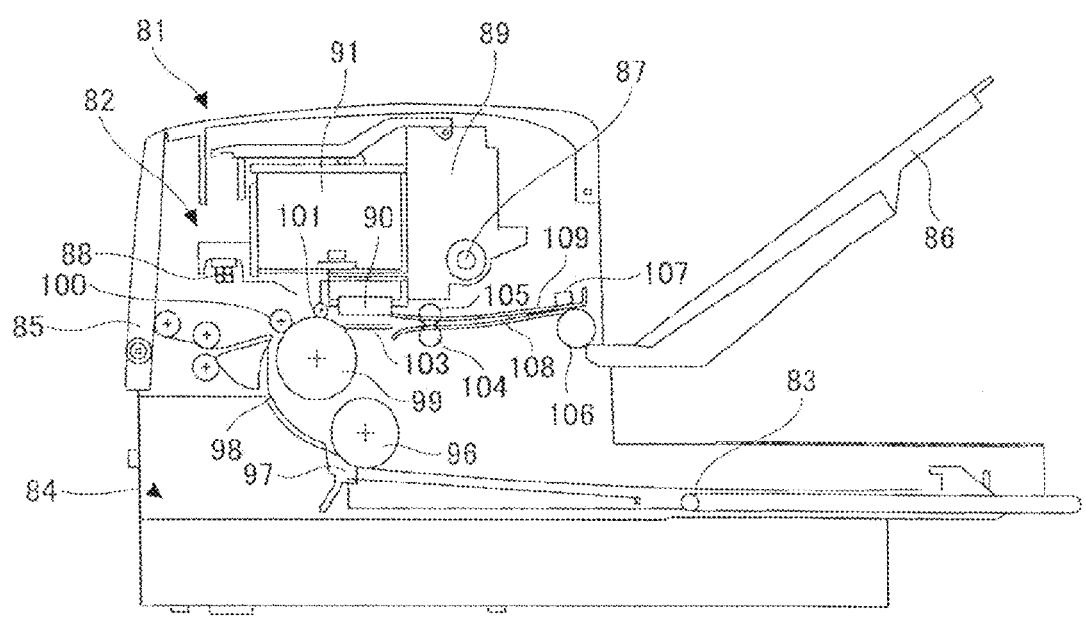
FIG. 9 is an explanatory side diagram illustrating the inkjet recording apparatus in the third embodiment.

The example of the inkjet recording apparatus is illustrated with reference to FIGS. 8 and 9. Note that FIG. 8 is a perspective diagram of the same recording apparatus, and FIG. 9 is a side diagram of a mechanical part of the same recording apparatus.

The inkjet recording apparatus 81 includes a print mechanical part 82 having a carriage 89 configured to move in a main-scanning direction, recording heads 90 formed of liquid ejection heads installed in the carriage 89, and a cartridge 91.

The inkjet recording apparatus 81 further includes, at its lower side, a removable paper feeding cassette (or a removable paper feeding tray) configured to contain a large amount of sheets 83 capable of being fed from a front side of the inkjet recording apparatus 81, or a manual feed tray 85 configured to be open to allow a user to feed sheets 83 by hands. The inkjet recording apparatus 81 may be able to receive sheets 83 from the paper feeding cassette 84 or the manual feed tray 85, record a desired image by the print mechanical part 82, and then discharge the sheets 83 to a paper discharge tray 86 attached to a rear side of the inkjet recording apparatus 81.

The print mechanical part 82 is configured to slidably hold the carriage 89 in the main-scanning direction by a main guide rod 87 and a sub-guide rod 88 that are laterally bridged between not-illustrated left and right side plates. The carriage 89 includes recording heads 90 composed of liquid ejection heads configured to eject ink droplets of respective colors of yellow (Y), cyan (C), magenta (M), and black (Bk) such that plural ink ejection ports (nozzles) of the liquid ejection heads are disposed in directions orthogonal to the main-scanning direction. Note that the recording heads 90 include the liquid ejection heads such that ink ejection directions of the liquid ejection heads are in downward directions. Further, the carriage 89 includes respective removable ink cartridges 91 configured to supply respective colors of ink to the recording heads 90.

Each of the ink cartridges 91 includes an air communication port configured to have communications with air in the upper part of the ink cartridge 91, an ink supply port in the lower part of the ink cartridge 91, and a porous body filled with ink inside the ink cartridge 91 such that ink to be supplied by capillary force of the porous body to the liquid ejection head is maintained in a slightly negative pressure. Further, the recording heads 90 of different colors are used as the recording head; however, one recording head having nozzles ejecting different colors of ink droplets may be employed as the recording head.

Note that a rear side (downstream of a paper conveyance direction) of the carriage 89 is slidably fitted to the main guide rod 87, and a front side (upstream of the paper conveyance direction) of the carriage 89 is slidably fitted to the sub-guide rod 88. Then, in order for the carriage 89 to move and scan in the main-scanning direction, a timing belt 95 is extended between a drive pulley 93 rotationally driven by a main scanning motor 92 and a driven pulley 94, and the timing belt 95 is fixed to the carriage 89. Thus, the carriage 89 is reciprocally driven by reciprocally driving the main scanning motor 92.

On the other hand, the inkjet recording apparatus 81 includes a paper feeding roller 96 and a friction pad 97 configured to separately feed each of the sheets 83 from the paper feeding cassette 84, and a guide member 98 configured to guide the sheets 83 so as to transport the sheets 83 set in the paper feeding cassette 84 to a lower side of the recording heads 90. Then, the inkjet recording apparatus 81 further includes a transfer roller 99 configured to reverse the fed sheet 83 and transfer the reversed sheet 83, a transfer rod 100 pressed against a peripheral surface of the transfer roller 99, and a leading end rod 101 configured to define a feeding angle of the sheet 83 from the transfer roller 99. The transfer roller 99 is configured to rotationally be driven by a sub-scanning motor 102 via a gear array.

Then, the inkjet recording apparatus 81 further includes a print receiving member 103 serving as a sheet guide member configured to guide the sheet 83 transferred from the transfer roller 99 at a lower side of the recording heads 90 corresponding to a moving range of the carriage 89 in the main-scanning direction. The inkjet recording apparatus 81 further includes a transfer rod 104 and a spur 105 downstream of the paper conveyance direction such that the transfer rod 104 and the spur 105 are configured to rotationally be driven for transferring the sheet 83 in a paper discharge direction. The inkjet recording apparatus 81 further includes a paper discharge roller 106 and a spur 107 that are configured to transfer the sheet 83 to the paper discharge tray 86, and guide members 108 and 109 that form a paper discharge channel.

When the inkjet recording apparatus 81 performs printing, the inkjet recording apparatus 81 drives the recording heads 90 based on an image signal while moving the carriage 89, ejects ink to the stopped sheet 83 to record one line on the sheet 83, transfers the sheet 83 in a predetermined amount, and then records a next line on the sheet 83. When the inkjet recording apparatus 81 receives a signal indicating that a rear end of the sheet 83 has reached a recording area, the inkjet recording apparatus 81 terminates a recording operation, and discharges the sheet 83.

Further, the inkjet recording apparatus 81 further includes a restoration apparatus 110 configured to restore the malfunctioning heads 90 that exhibits ejection failure. The restoration apparatus 110 includes a cap device, a suction device, and a cleaning device. The carriage 89 that is in a standby mode moves toward the restoration apparatus 110 so that the heads 90 are capped by the capping device to maintain the ejecting ports in a wetted status. Hence, the heads 90 exhibiting ejection failure due to dried ink may be prevented. Further, predetermined ink viscosity may be maintained for all the ejecting ports by ejecting ink unassociated with recording while performing recording operations. Hence, stable ejecting performance may be maintained.

When ejection failure has occurred, the ejecting ports (nozzles) of the heads 90 are tightly sealed with the capping device, then ink, bubbles and the like are suctioned by the suction device from the ejecting ports via tubes, and ink, dust and the like attached to surfaces of the ejecting ports are removed by the cleaning device. Hence, the ejection failure may be resolved to restore normal ejecting operations. Further, the suctioned ink is discharged in a waster ink reservoir (not illustrated) disposed at a lower part of a main body, and the discharged ink is absorbed and held by an ink absorber inside the waster ink reservoir.

Hence, since the inkjet recording apparatus serving as the liquid ejection apparatus of the second embodiment includes the liquid ejection head illustrated in the second embodiment, the liquid ejection apparatus of the second embodiment does not exhibit ink ejection failure due to failure in driving the diaphragm, and exhibits stable ink droplets ejection properties. Hence, improved image quality may be obtained.

Fourth Embodiment

A fourth embodiment describes a configuration example of a deflection mirror provided with the electromechanical transducer film obtained by the fabrication method of the electromechanical transducer film of the first embodiment.

Figure 10:
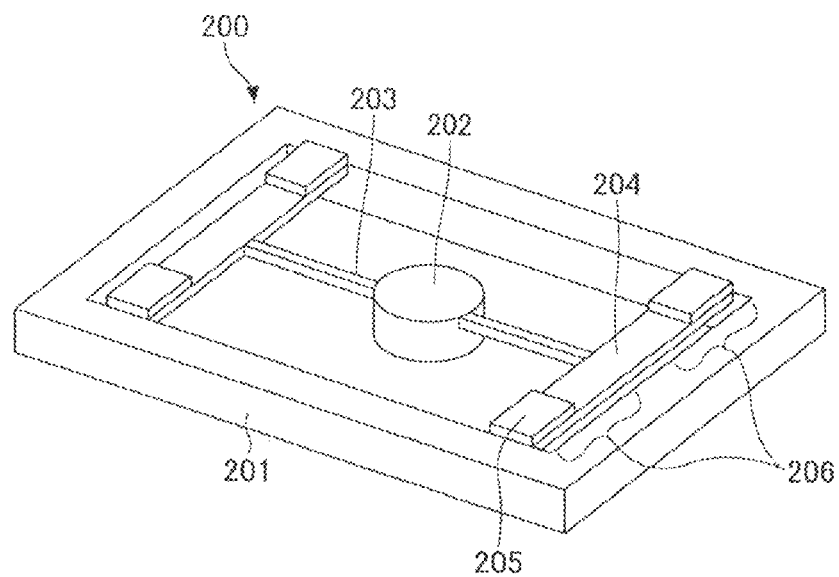
FIG. 10 is an explanatory perspective diagram illustrating a piezoelectric MEMS mirror in a fourth embodiment.

FIG. 10 illustrates a perspective diagram of a piezoelectric micro-electromechanical systems (MEMS) mirror as a configuration example of the deflection mirror.

The piezoelectric MEMS mirror 200 includes a fixing base 201, a mirror part 202 having a reflection surface, an elastic supporting member 203 supporting the mirror part 202, and beam-like members 204 supporting parts of the elastic supporting member 203 from opposite ends of the elastic supporting member 203. The piezoelectric MEMS mirror 200 further includes electromechanical elements 205 adhered to the beam-like members 204.

In the piezoelectric MEMS mirror 200, a voltage is applied to the electromechanical transducer element 205 to distort a drive part 206, which causes the mirror part 202 to oscillate. The performance of the piezoelectric MEMS mirror 200 may be improved by applying the electromechanical transducer film fabricated by the fabrication method of the electromechanical transducer film of the first embodiment to the electromechanical transducer film of the electromechanical transducer element of the piezoelectric MEMS mirror 200.

Fifth Embodiment

A fifth embodiment describes a configuration example of an acceleration sensor provided with the electromechanical transducer film obtained by the fabrication method of the electromechanical transducer film of the first embodiment.

Figure 11:
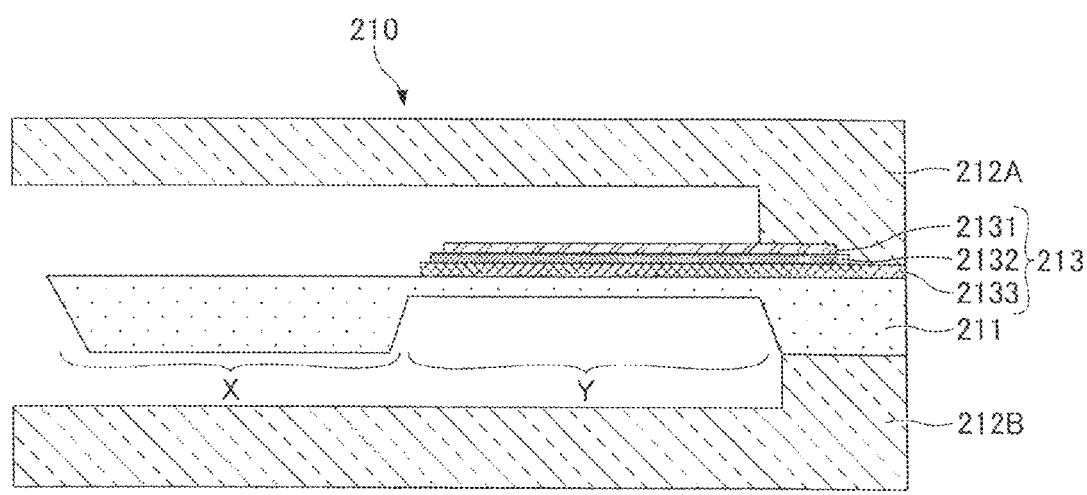
FIG. 11 is an explanatory cross-sectional diagram illustrating an acceleration sensor in a fifth embodiment.

FIG. 11 illustrates a cross-sectional diagram illustrating the acceleration sensor of the fifth embodiment.

The acceleration sensor 210 includes a silicon substrate 211 having a thick part X and a thin part Y, and glass substrates 212A and 212B configured to sandwich the silicon substrate 211. The acceleration sensor 210 further includes an electromechanical transducer element 213 that is formed in the thin part Y of the silicon substrate and has an upper electrode 2131, an electromechanical transducer film 2132, and a lower electrode 2133.

When additional acceleration is applied to the acceleration sensor 210, the electromechanical transducer element 213 deforms together with the thick part X. The acceleration sensor 210 detects the acceleration by converting an amount of displacement of the electromechanical transducer element 213 into a voltage. The performance of the acceleration sensor 210 may be improved by applying to the acceleration sensor 210 the electromechanical transducer film obtained by the fabrication method of the electromechanical transducer film of the first embodiment.

Sixth Embodiment

A sixth embodiment describes a configuration example of a hard disk drive (HDD) micromanipulator provided with the electromechanical transducer film obtained by the fabrication method of the electromechanical transducer film of the first embodiment.

Figure 12:
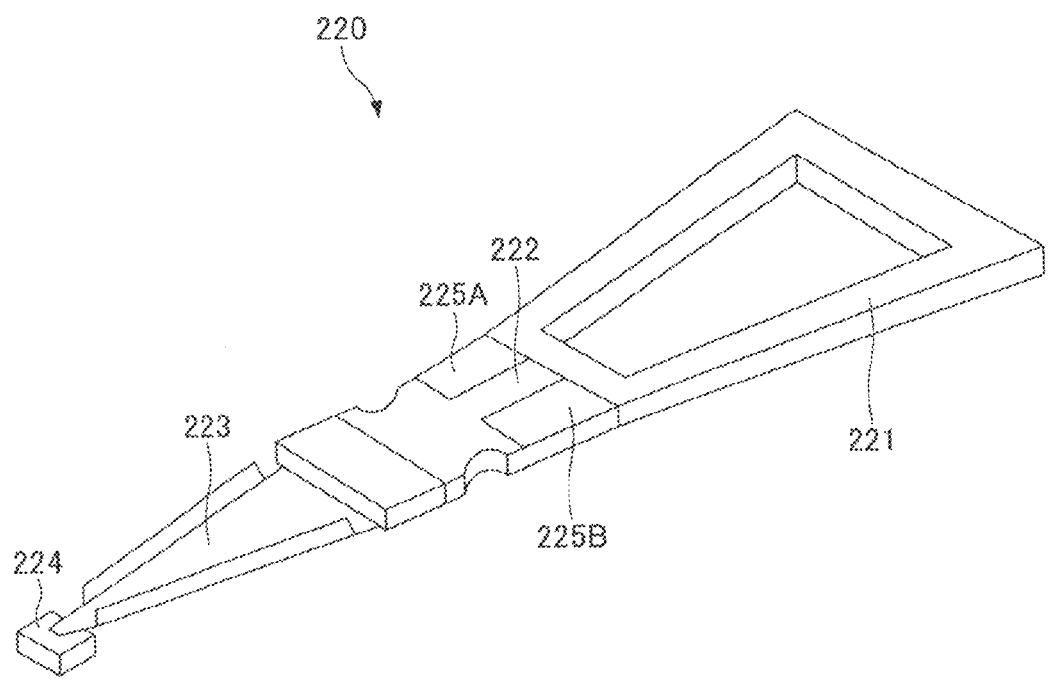
FIG. 12 is an explanatory perspective diagram illustrating an HDD head micromanipulator in a sixth embodiment.

FIG. 12 illustrates a perspective diagram illustrating the HDD micromanipulator of the sixth embodiment.

The HDD micromanipulator 220 includes a movable access arm 221, a head 224 attached to a leading end of a supporting spring 223 via a middle member 222, and electromechanical transducer elements 225A and 225B attached to the middle member 222. The HDD micromanipulator 220 alternately expands and contracts the electromechanical transducer elements 225A and 225B to move the HDD micromanipulator 220 at a predetermined position of the HDD so as to finely adjust the HDD head.

The performance of the HDD micromanipulator 220 may be improved by applying to the HDD micromanipulator 220 the electromechanical transducer film obtained by the fabrication method of the electromechanical transducer film of the first embodiment.

Seventh Embodiment

A seventh embodiment describes a configuration example of a ferroelectric memory element provided with the electromechanical transducer film obtained by the fabrication method of the electromechanical transducer film of the first embodiment.

Figure 13:
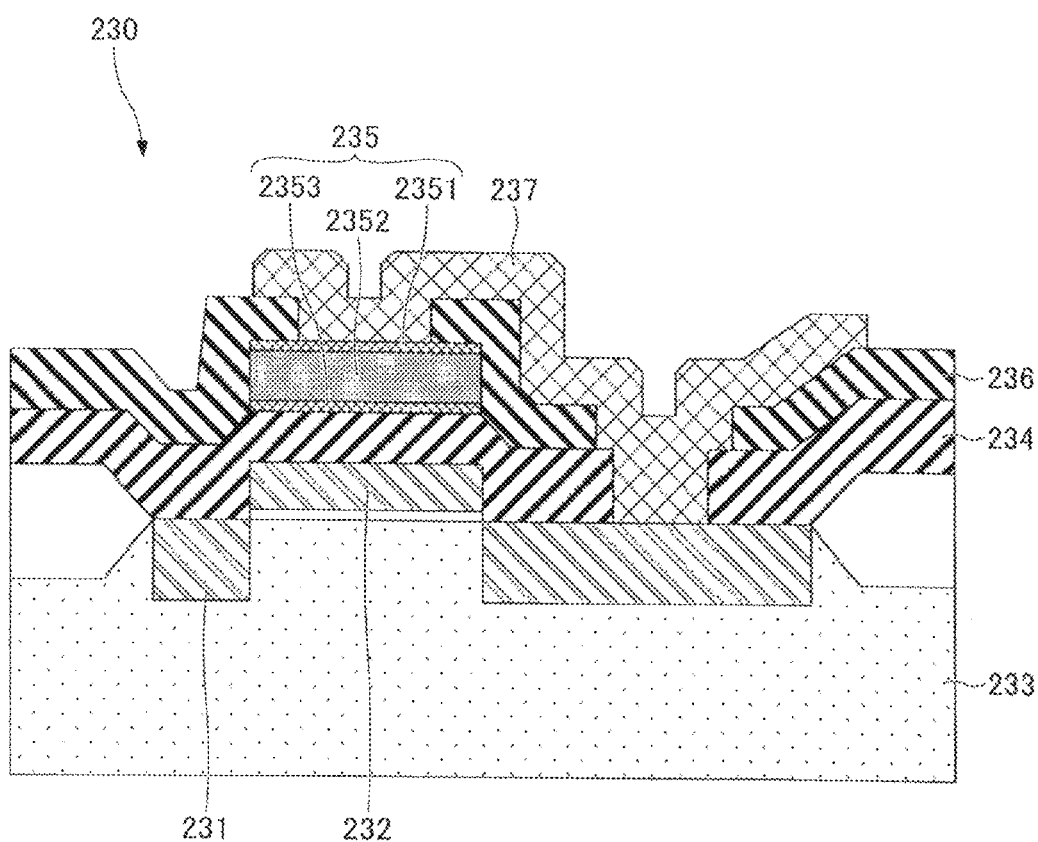
FIG. 13 is an explanatory cross-sectional diagram illustrating a ferroelectric memory in a seventh embodiment.

FIG. 13 illustrates a cross-sectional diagram illustrating a ferroelectric memory 230 of the sixth embodiment.

The ferroelectric memory 230 includes a substrate 233 having a bit line 231 and a word line 232. Then, the ferroelectric memory 230 further includes an interlayer dielectric film 234 formed on the substrate 233, and an electromechanical transducer element 235 that is formed on the interlayer dielectric film 234, and has an upper electrode 2351, an electromechanical transducer film 2352, and a lower electrode 2353. The ferroelectric memory 230 further includes an interlayer dielectric film 236 formed on the electromechanical transducer element 235, and an interconnect 237 electrically coupled with the upper electrode 2351 via a contact hole.

The ferroelectric memory 230 functions as memory by utilizing inversion of residual dielectric polarization of the electromechanical transducer film 2352 generated by the application of voltage to the upper electrode 2351 and the lower electrode 2353. The performance of the ferroelectric memory 230 may be improved by applying to the ferroelectric memory 230 the electromechanical transducer film obtained by the fabrication method of the electromechanical transducer film of the first embodiment.

Eighth Embodiment

A eighth embodiment describes a configuration example of an angular velocity sensor provided with the electromechanical transducer film obtained by the fabrication method of the electromechanical transducer film of the first embodiment.

Figure 14:
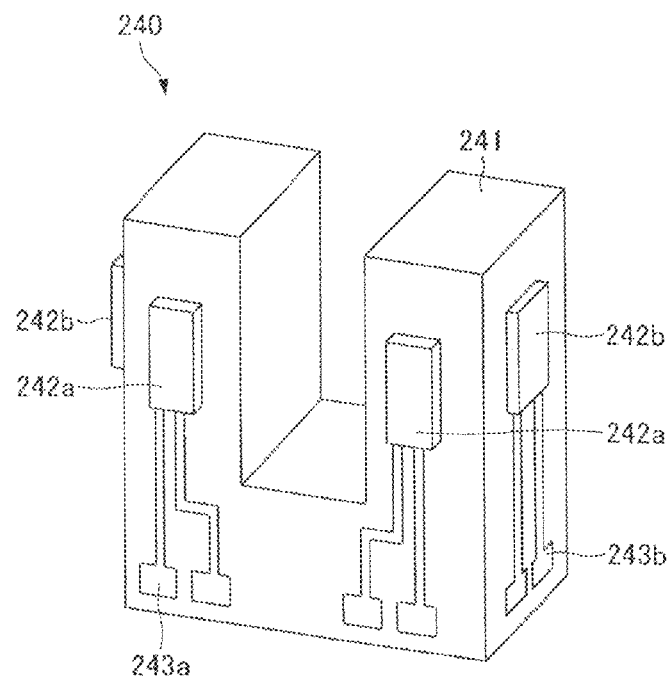
FIG. 14 is an explanatory perspective diagram illustrating a vibrating gyroscope angular velocity sensor in an eighth embodiment.

FIG. 14 illustrates a perspective diagram illustrating a configuration example of a vibrational gyroscope type angular velocity sensor 240 of the eighth embodiment.

The vibrational gyroscope type angular velocity sensor 240 includes a tuning fork 241 formed of a material exhibiting low thermal expansion. The vibrational gyroscope type angular velocity sensor 240 further includes oscillation drive electromechanical transducer elements 242a, detection electromechanical transducer elements 242b, pads corresponding to the oscillation drive electromechanical transducer elements 242a, and pads corresponding to the detection electromechanical transducer elements 242b that are attached to the tuning fork 241.

The oscillation drive electromechanical transducer elements 242a and the detection electromechanical transducer elements 242b are formed on respective vertical surfaces. The vibrational gyroscope type angular velocity sensor 240 detects the vibration of the detection electromechanical transducer elements 242b via the respective pads 243 to detect the angular velocity based on the frequency difference. The performance of the vibrational gyroscope type angular velocity sensor 240 may be improved by applying the electromechanical transducer film fabricated by the fabrication method of the electromechanical transducer film of the first embodiment to the electromechanical transducer film of the electromechanical transducer element of the vibrational gyroscope type angular velocity sensor 240.

Ninth Embodiment

A ninth embodiment describes a configuration example of a micropump provided with the electromechanical transducer film obtained by the fabrication method of the electromechanical transducer film of the first embodiment.

Figure 15:
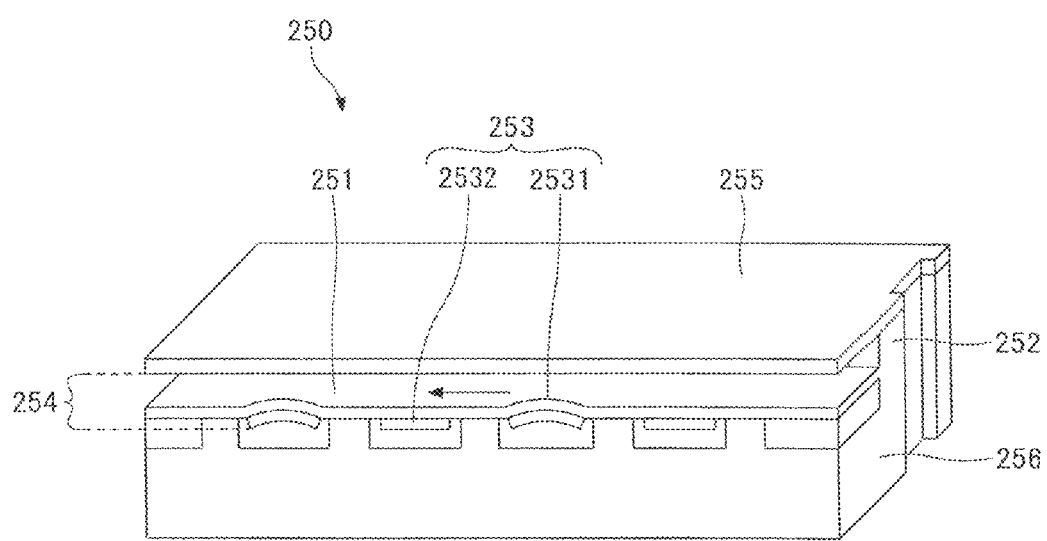
FIG. 15 is an explanatory perspective diagram illustrating a micropump in a ninth embodiment.

FIG. 15 is a perspective diagram of a micropump of the ninth embodiment.

The micropump 250 includes a substrate 252 including a channel 251, and piezoelectric actuators 253 each including a diaphragm 2531 and an electromechanical transducer element 2532 closely attached to the diaphragm 2531. The micropump 250 further includes a channel forming substrate 254 having two or more the piezoelectric actuators 253, a cover substrate 255, and a protection substrate 256. The micropump 250 repeatedly suctions a fluid or discharges the suctioned fluid by driving the diaphragms 2531 sequentially in a direction indicated by an arrow in FIG. 15 so as to transport the fluid inside the channel 251. The transport efficiency may be improved by modifying shapes of a liquid inlet hole or a liquid outlet hole, or disposing a valve in the channel 251. The performance of the micropump 250 may be improved by applying the electromechanical transducer film fabricated by the fabrication method of the electromechanical transducer film of the first embodiment to the electromechanical transducer film of the electromechanical transducer element 2532 of the micropump 250.

Tenth Embodiment

A tenth embodiment describes a configuration example of a microvalve provided with the electromechanical transducer film obtained by the fabrication method of the electromechanical transducer film of the first embodiment.

Figure 16:
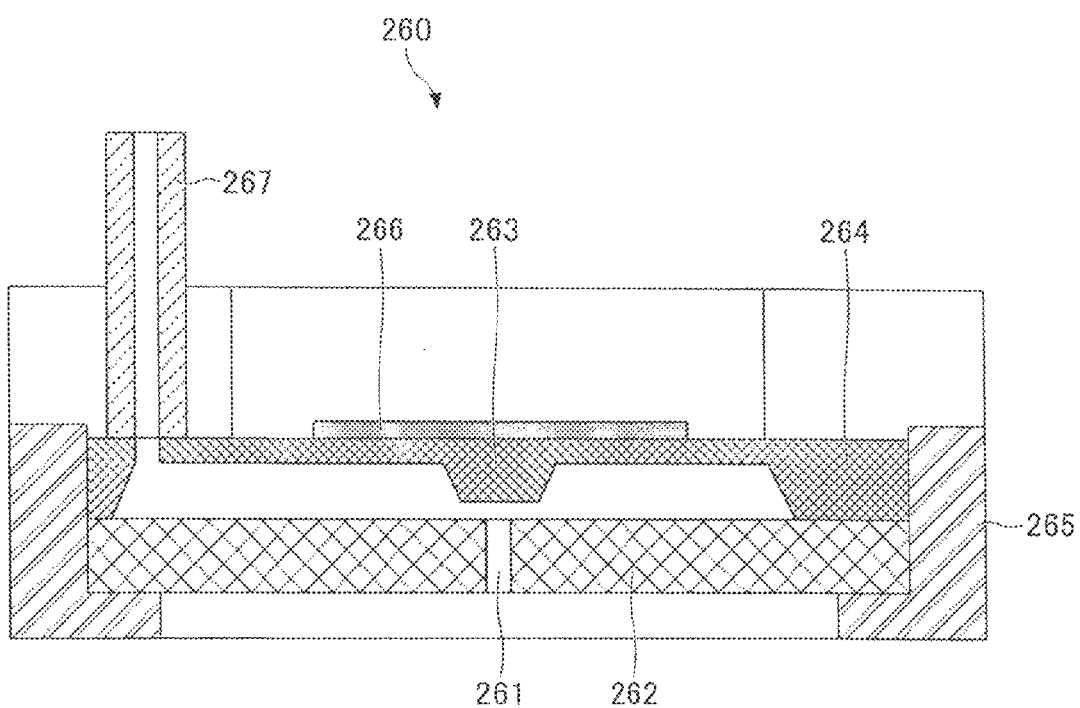
FIG. 16 is an explanatory perspective diagram illustrating a microvalve in a tenth embodiment.

FIG. 16 is a perspective diagram of a microvalve of the tenth embodiment.

The microvalve 260 includes a disk-shaped substrate 262 having an ejection port 261 in the middle of the disk-shaped substrate 262, and a diaphragm 264 having a projection 263 serving as a valve in the middle of the diaphragm 264. The microvalve 260 further includes fixing parts 265 to fix the substrate 262 and the diaphragm 264, an electromechanical transducer element 266 formed on the diaphragm 264, and an inlet port 267 into which a fluid flows. The microvalve 260 opens or closes the ejecting port 261 utilizing the vibration of the projection 263 generated by distortion of the electromechanical transducer element 266 so as to control a flow of a fluid. The performance of the microvalve 260 may be improved by applying to the microvalve 260 the electromechanical transducer film obtained by the fabrication method of the electromechanical transducer film of the first embodiment.

EXAMPLES

In the following, specific examples are described; however, the above-described embodiments are not limited to these examples.

Example 1

An illustration is given of steps of a procedure conducted in Example 1 with reference to FIGS. 17A to 17D, and FIGS. 18A to 18F.

Figure 17A:
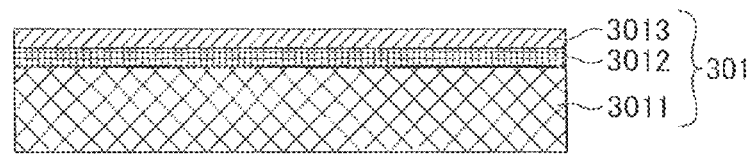
FIGS. 17A to 17D are explanatory diagrams illustrating fabrication steps in Example 1.

As illustrated in FIG. 17A, a base substrate 301 was prepared by layering a $TiO_2$ layer serving as a base layer 3012, and a platinum (Pt) layer serving as a first electrode 3013 in this order on one of surfaces of a substrate 3011. In preparing the above base substrate 301, the film thickness of the base layer 3012 was 50 nm, and the film thickness of the first electrode 3013 was 250 nm.

Figure 17B:
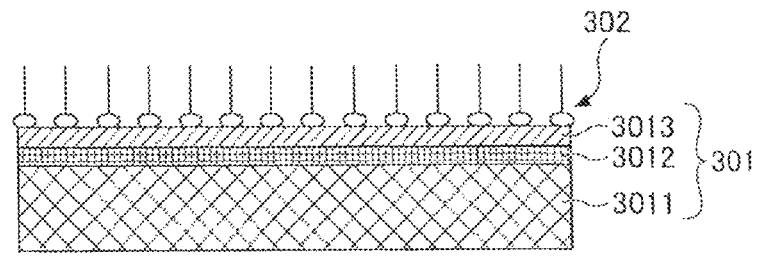

Subsequently, as illustrated in FIG. 17B, a liquid-repellant treatment step was conducted on the base substrate 301. That is, a SAM film 302 was formed on the first electrode 3013 disposed on an outermost surface of the base substrate 301.

The SAM film 302 was obtained by immersing the base substrate 301 in the alkanethiol solution serving as a liquid-repellent treatment liquid for several seconds to allow molecules to be arranged by themselves. In the liquid-repellent treatment liquid, dodecanethiol $CH_3(CH_2)_{11}$—SH served as alkanethiol, and dehydrated ethanol served as a solvent, and the solution concentration was 0.1 m mol/l.

After the base substrate 301 was immersed in the alkanethiol solution, the entire surface of the base substrate was washed with ethanol, and then further washed with pure water. Subsequently, the washed base substrate was dried under a nitrogen atmosphere. The contact angle of the SAM film formed on the first electrode 3013 of the base substrate 301 with respect to a sol-gel liquid was 105 degrees, which indicated liquid-repellency.

Figure 17C:
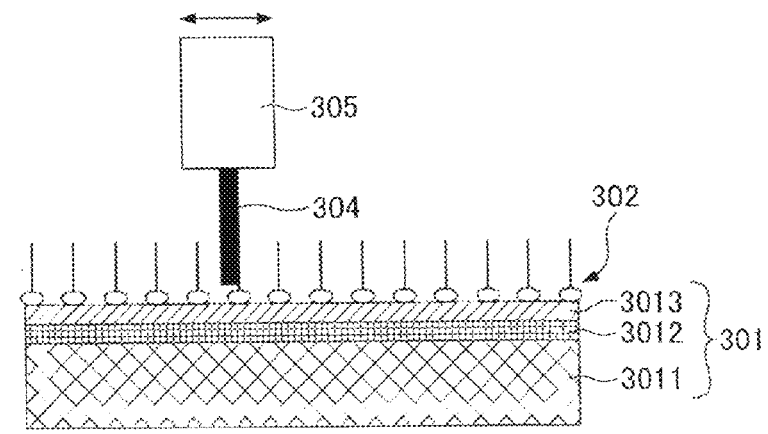

Subsequently, as illustrated in FIG. 17C, an energy ray irradiation step was conducted. In the energy ray irradiation step, the base substrate 301 on which the SAM film 301 was formed was irradiated with an energy ray. A laser light oscillator 305 was used as an energy ray irradiation device. The laser light oscillated by the laser light oscillator 305 was a KrF excimer laser light (wavelength: 248 nm).

Then, the base substrate 301 on which the SAM film 301 was formed was irradiated with the laser light by moving the laser light oscillator 305 to allow an irradiation position of a laser beam serving as the energy ray 304 to match an alignment mark and an electromechanical transducer liquid film pattern formed in the electromechanical transducer liquid film forming step. Note that the irradiation with the energy ray was conducted by setting an industrial inkjet apparatus 50 illustrated in FIG. 5.

An illustration is given of the electromechanical transducer film pattern and the alignment mark formed in the above step. The base substrate 301 used in Example 1 had a circular shape having an cutout at its lower end as illustrated in FIG. 2A.

The electromechanical transducer film pattern portions were formed in an area C of FIG. 2A. Each of the electromechanical transducer film pattern portions had a width of 50 μm, and a length of 1000 μm, which indicated that the electromechanical transducer film pattern portions formed were long patterns. Then, as illustrated in FIG. 2B, the electromechanical transducer film pattern portions were disposed at 1:2 pitch (a space width-100 μm) in a width direction to form an electromechanical transducer pattern portion array 23. Note that the longitudinal direction of the electromechanical transducer film pattern portion 24 set was parallel to a scanning direction (a Y direction of FIG. 5) of the substrate in the industrial inkjet apparatus. Further, the width direction of the electromechanical transducer film pattern portion 24 set was parallel to a nozzle array direction (an X direction of FIG. 5) of the inkjet head 53 configured to apply a sol-gel liquid in the industrial inkjet apparatus 50.

Further, as illustrated in FIG. 2A, respective sol-gel liquid supply areas A and B having 3 mm×30 mm were disposed at the opposite ends of the substrate, and a 50 μm square alignment mark was formed in the middle of each of the sol-gel liquid supply areas A and B.

Figure 17D:
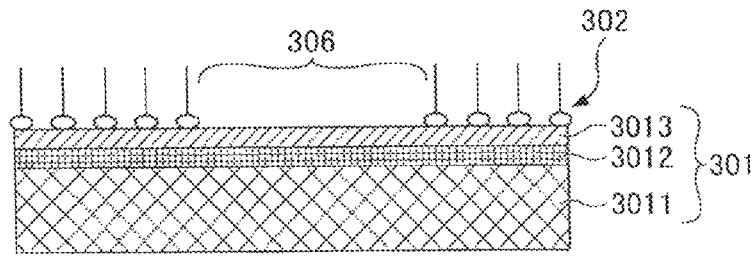

Then, as illustrated in FIG. 17D, after the energy ray irradiation step, an area 306 irradiated with a laser beam was observed to be lyophilic.

Specifically, the contact angle of the area 306 irradiated with a laser beam, including the electromechanical transducer film pattern portion and the alignment mark portion, with respect to the sol-gel liquid measured by a micro-contact angle meter was observed to be 30 degrees or less. That is, the portion irradiated with the excimer laser beam was lyophilic because the SAM film was removed from that portion, and the difference in the contact angle between the inside the irradiated area and the outside the irradiated area was observed to be 70 degrees or more.

Next, as illustrated in FIG. 18A, an alignment mark forming step was conducted. The alignment mark forming step was conducted by applying a sol-gel liquid serving as a PZT precursor by an inkjet method to the sol-gel liquid supply areas A and B on the base substrate illustrated in FIG. 2A. Note that the alignment mark forming step was also conducted by utilizing the industrial inkjet apparatus 50 illustrated in FIG. 5.

The sol-gel liquid employed is illustrated below. Lead acetate trihydrate, titanium isopropoxide, and zirconium isopropoxide were used as starting materials for the sol-gel liquid. Crystal water of the lead acetate was dissolved in methoxyethanol, and was then dehydrated.

Titanium isopropoxide and zirconium isopropoxide were dissolved in methoxyethanol to promote an alcohol exchange reaction and an esterification reaction, and the obtained product was mixed with the lead acetate dissolved methoxyethanol to obtain a sol-gel liquid. The concentration of the PZT solid content of the sol-gel liquid was 0.1 mol/l.

Note that in preparing the sol-gel liquid, the amount of lead acetate added was adjusted such that the amount of lead was made surplus by 10 mol % to the stoichiometry. The amount of lead acetate added was adjusted as above in order to prevent the degradation of crystallinity due to lead deficiency during the heat treatment.

When the sol-gel liquid was applied, a landed liquid droplet size of the sol-gel liquid applied was adjusted to be approximately 30 μm based on the ejection condition of the inkjet head.

When the sol-gel liquid was applied to the sol-gel liquid supply areas, a periphery of the alignment mark portion was observed as illustrated in FIG. 3A.

Initially, the sol-gel liquid landed in the alignment mark portion (a lyophilic area 31) was spread within the alignment mark portion. By contrast, the sol-gel liquid droplets landed outside the alignment mark portion (a liquid-repellent area) maintained their semispherical shapes when they were landed.

The liquid droplets 32A and 32B of the sol-gel liquid landed over an edge line of the alignment mark portion (a lyophilic area 31) moved toward directions indicated by arrows in FIG. 3A due to the surface energy difference between the lyophilic area and the liquid-repellent area. As a result, the liquid droplets 32A and 32B of the sol-gel liquid were attracted to the alignment mark portion.

Thus, the contrast of the edge line of the alignment mark portion (the lyophilic area 31) was clearly maintained, and the alignment mark was distinctly displayed.

Then, the alignment mark was detected by an imaging apparatus, and a print position detection step to detect a print position based on the alignment mark was conducted. In the print position detection step, the print position of the electromechanical transducer film was detected based on positional data of the alignment mark detected and print data of the electromechanical transducer film.

Example 2

In order for the alignment mark portion to have the same configuration as that illustrated in FIG. 4A, the liquid-repellent treatment step, the energy ray irradiation step, and the alignment mark forming step were conducted in a manner the same as those of Example 1 except for the following points.

The shape of the alignment mark was formed of central parts of two rectangles. That is, the shape of the alignment mark was a cross-shape obtained by allowing the two rectangles to intersect at right angles. Note that in this case, one of the rectangles had a width of 50 μm, and a length of 1000 μm.

In the energy ray irradiation step, when the alignment marks were formed in the sol-gel liquid supply areas A and B in FIG. 2A, a periphery of the alignment mark was irradiated with the energy ray to form a lyophilic area excluding the alignment mark in each of the sol-gel liquid supply areas.

Note that in the alignment mark forming step, when the liquid droplets of the sol-gel liquid were applied to the sol-gel liquid supply areas, the landed liquid droplet size of the sol-gel liquid was adjusted to be approximately 30 μm.

In Example 2, since the periphery of the alignment mark portion was irradiated with laser light, the periphery of the alignment mark portion was a lyophilic area. Thus, the alignment mark portion was a liquid-repellent area.

When the sol-gel liquid was applied to the sol-gel liquid supply areas, the periphery of the alignment mark portion was observed as illustrated in FIG. 4A.

Initially, the sol-gel liquid landed at the periphery of the alignment mark portion was spread within the lyophilic area at the periphery of the alignment mark portion. By contrast, the sol-gel liquid droplets landed in the alignment mark portion (a liquid-repellent area 41) maintained their semispherical shapes when they were landed.

The liquid droplets 42A of the sol-gel liquid landed over an edge line of the alignment mark portion and moved toward directions indicated by arrows in FIG. 4A due to the surface energy difference between the lyophilic area and the liquid-repellent area. As a result, the liquid droplets 42A of the sol-gel liquid were attracted to the periphery (lyophilic area) of the alignment mark portion.

Thus, the contrast of the edge line of the alignment mark portion was clearly maintained, and the alignment mark was distinctly displayed.

Then, the alignment mark was detected by an imaging apparatus, and a print position detection step to detect a print position based on the alignment mark was conducted. In the print position detection step, the print position of the electromechanical transducer film was detected based on positional data of the alignment mark detected and print data of the electromechanical transducer film.

Example 3

The electromechanical transducer film was formed in the following procedure on the substrate with respect to which the print position of the electromechanical transducer film was detected by the alignment mark in Examples 1 and 2.

A sol-gel liquid serving as a PZT precursor in Examples 1 and 2 was used in Example 3.

Initially, the electromechanical transducer liquid film forming step was conducted. That is, as illustrated in FIG. 18A, the sol-gel liquid was applied by the inkjet head 308 to the electromechanical transducer film pattern portion 307, which was irradiated with the energy ray in the energy ray irradiation step, based on the detected print position information of the electromechanical transducer film. The application of the sol-gel liquid was conducted by utilizing the industrial inkjet apparatus illustrated in FIG. 5.

As illustrated in FIG. 18C, the sol-gel liquid ejected from the inkjet head 308 was uniformly leveled in a surface modification portion that was a sol-gel liquid ejected area of the surface of the first electrode 3013, that is, only within a lyophilic area. In this case, the electromechanical transducer liquid film 309 was formed in the area not irradiated with laser light in the energy ray irradiation step of the surface of the first electrode 3013 without allowing the sol-gel liquid to exceed that area. That is, the electromechanical transducer liquid film 309 was formed in the liquid-repellent portion of the surface of the first electrode 3013 without exceeding the liquid-repellent portion. This may result from the contrast between the contact angle inside the electromechanical transducer film pattern portion 307 and the contact angle at the periphery of the electromechanical transducer film pattern portion 307.

Next, as illustrated in FIG. 18E, a heat treatment step was conducted. In the heat treatment step, a drying step was conducted to dry the solvent of the sol-gel liquid at 120° C. Subsequently, an organic product contained in the sol-gel liquid was thermally decomposed (at 500° C.) to produce the electromechanical transducer film 310. The film thickness of the electromechanical transducer film obtained was approximately 80 nm. Further, the SAM film was eliminated by the thermal decomposition.

Figure 19:
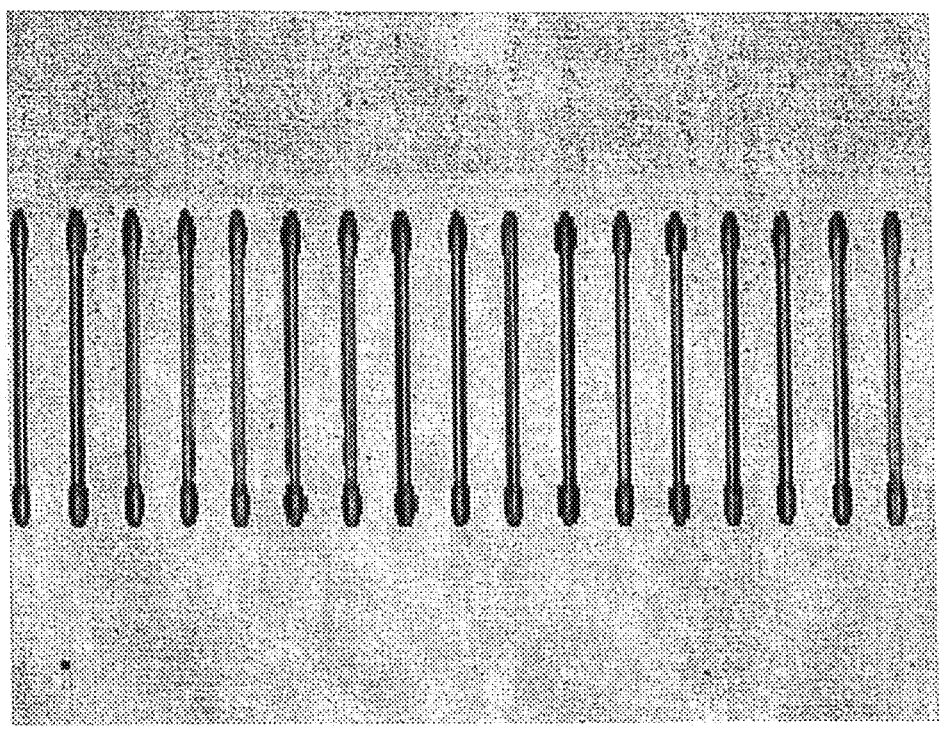
FIG. 19 is a top surface photograph of an electromechanical transducer film fabricated in Example 3.

FIG. 19 illustrates an image obtained from the upper surface of the obtained electromechanical transducer film.

As a repeating process, after the entire surface of the base substrate 301, on which the electromechanical transducer film obtained as illustrated in FIG. 18E, was washed with isopropyl alcohol, the liquid-repellent treatment step to similarly form the SAM film 302 by immersing the substrate in the liquid-repellent treatment liquid was conducted. As illustrated in FIG. 18B, since the SAM film 302 was not formed on the electromechanical transducer film 310 serving as an oxide film, the SAM film 302 pattern was formed only outside the electromechanical transducer film 310.

Note that as a result of the above heat treatment step, the alignment marks within the sol-gel liquid supply areas of Examples 1 and 2 were solidified so as to be clearly identifiable. Thus, in the electromechanical transducer liquid film forming step, the print position was accurately detected and located by utilizing the alignment marks.

Then, as illustrated in FIG. 18B, the sol-gel liquid was applied again by the inkjet head 308 to the upper surface of the electromechanical transducer film 310 to form a new electromechanical transducer liquid film 311 on the upper surface of the electromechanical transducer film 310 as illustrated in FIG. 18D. Note that the sol-gel liquid was applied to the electromechanical transducer film 310 after pre-ejection of the sol-gel liquid was conducted outside the substrate.

Subsequently, the heat treatment step was conducted in the same condition as when the (first) electromechanical transducer film 310 was formed at the first time. As a result, as illustrated in FIG. 18F, an electromechanical transducer film 312 including the (first) electromechanical transducer film 310 and the second electromechanical transducer film in layer was obtained. The sum of the film thicknesses of the two layers of the electromechanical transducer films in this case was approximately 160 nm.

Further, steps illustrated in FIGS. 18B, 18D, and 18F were conducted again to form another layer of an electromechanical transducer film layered on the above two layers of the electromechanical transducer films. As a result, the electromechanical transducer film having the total film thickness of 240 nm was obtained. Then, the heat treatment step was further conducted to perform a crystallization process on the obtained electromechanical transducer film. The heat treatment step was conducted by a rapid thermal annealing (RTA) at 700° C.

When a state of the electromechanical transducer film after the heat treatment step was checked, no cracking or the like was observed in the electromechanical transducer film.

Figure 20:
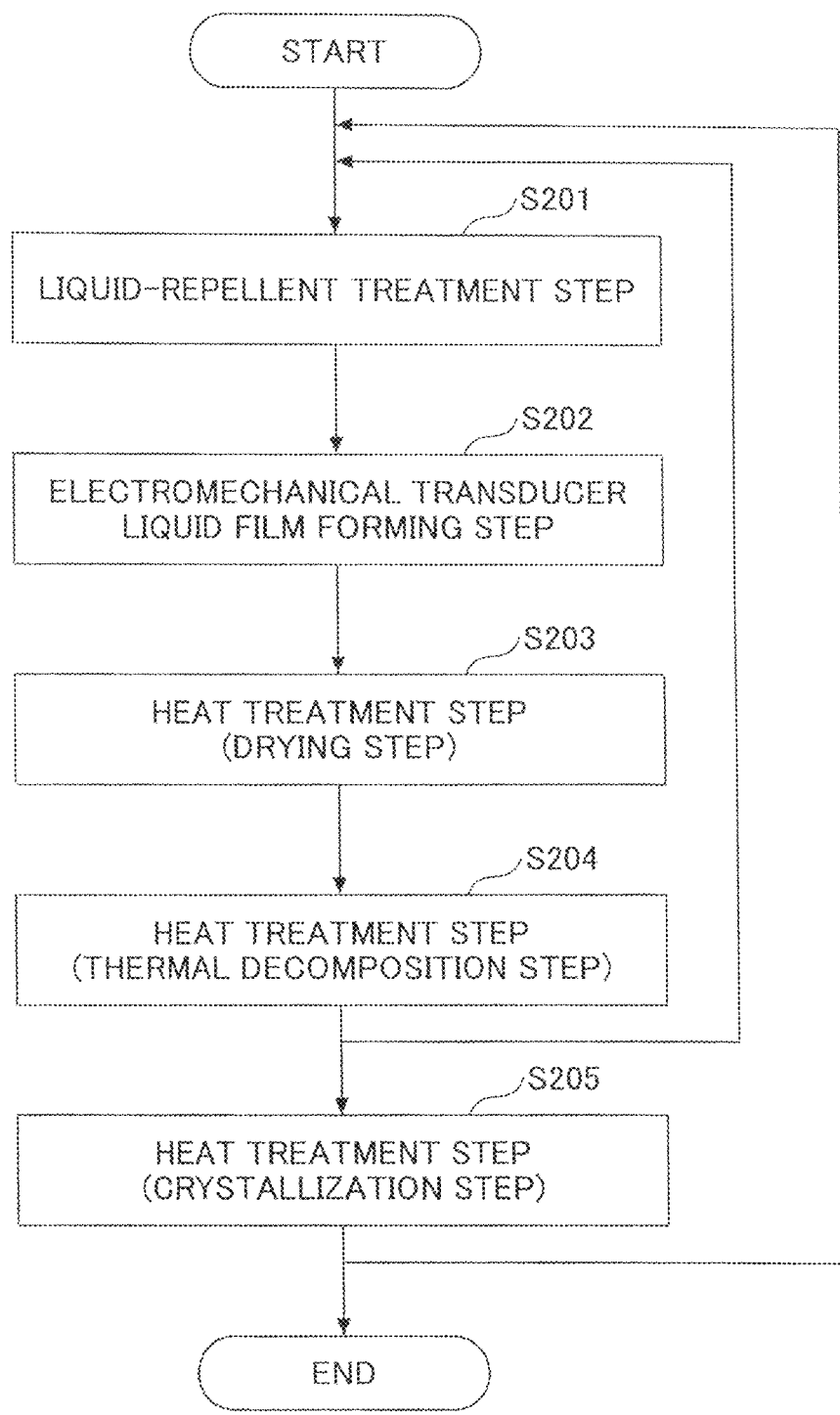
FIG. 20 is a repeated fabrication flow of the electromechanical transducer film in Example 3.

Further, three layers of electromechanical transducer films were formed on the obtained electromechanical transducer film by following a repeated fabrication flow of the electromechanical transducer film illustrated in FIG. 20.

Initially, as the liquid-repellent step (S201), after the base substrate 301 on which the electromechanical transducer film was formed was washed with isopropyl alcohol, the SAM film 302 was similarly formed by immersing the substrate in the liquid-repellent treatment liquid.

Subsequently, as the electromechanical transducer liquid film forming step (S202), the sol-gel liquid was applied by the inkjet head 308 to the upper surface of the already formed electromechanical transducer film to form a new electromechanical transducer liquid film on the upper surface of the already formed electromechanical transducer film as illustrated in FIG. 18B.

Then, the heat treatment step (S203) serving as the drying step was conducted at 120° C. to dry the solvent of the sol-gel liquid.

Subsequently, as the heat treatment step (S204) serving as the thermal decomposition step, the heat treatment was conducted at 500° C. to thermally decompose the organic produce contained in the sol-gel liquid to obtain an electromechanical transducer film.

After steps S201 to S204 were repeatedly conducted three times, rapid thermal processing (RTP) was conducted at 700° C. as the heat treatment step (S205) serving as a crystallization step.

No defect such as cracking or the like was observed in the obtained electromechanical transducer film, and the film thickness of the obtained electromechanical transducer film reached 0.5 μm.

Thereafter, after steps S201 to S204 were repeatedly conducted three times, six cycles of the heat treatment step (S205) serving as the crystallization step were conducted based on the same condition. That is, the application of the sol-gel liquid was conducted 24 times including the above-described six times (six cycles) to form an electromechanical transducer film.

The film thickness of the obtained electromechanical transducer film reached 2.4 μm, and no cracking or the like was observed in the obtained electromechanical transducer film. Hence, the electromechanical transducer film having a desired shape was obtained by the above-described operations.

Example 4

A platinum layer having the film thickness of 250 nm was formed as a second electrode (an upper electrode) on the electromechanical transducer film obtained in Example 3. As a result, an electromechanical transducer element was obtained.

Electric characteristics and an electromechanical transformation capability (a piezoelectric constant) of the electromechanical transducer element were evaluated. The electromechanical transducer film exhibited excellent electric characteristics as the relative dielectric constant was 1580, the dielectric loss was ranged from 0.02 to 0.05, and the pressure resistance was 53 V.

Further, the residual dielectric polarization was 11.2 pC/cm$^2$, and the coercive electric field was 28.3 kVcm. Thus, characteristics similar to those of a normal sintered ceramic body were observed.

Figure 21:
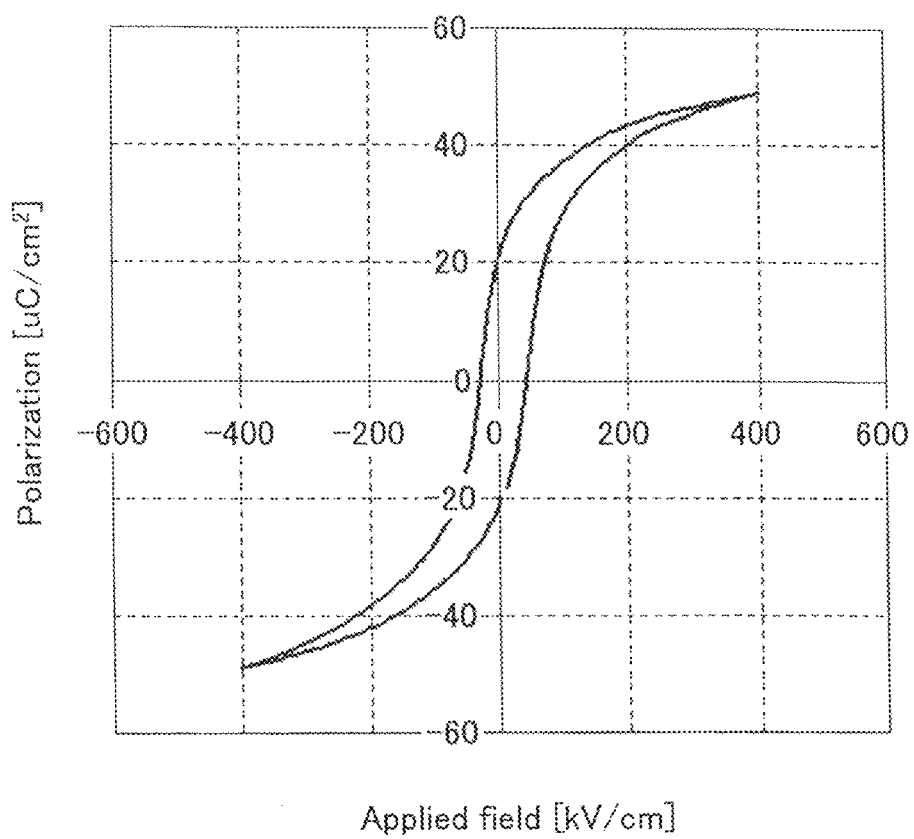
FIG. 21 is a P-E hysteresis curve of an electromechanical transducer element obtained in Example 4.

FIG. 21 illustrates an obtained P-E hysteresis curve.

The electromechanical transformation capability was computed by measuring the deformation amount due to the application of electric field using a laser Doppler vibrometer, and matching the measured deformation amount and a simulated model (a simulated result). As a result, the piezoelectric constant $d_{31}$ obtained was 146 μm/V. Thus, the obtained value was similar to that of the sintered ceramic body. The obtained result exhibited a characteristic value that was sufficient for designing the liquid ejection head.

The above-described embodiments may provide a fabrication method capable of forming the electromechanical transducer film and the alignment mark in a simpler and more convenient manner compared to the related art fabrication method.

The present invention is not limited to the specifically disclosed embodiments, and variations and modifications may be made without departing from the scope of the present invention.

The present application is based on Japanese Priority Application No. 2013-246509 filed on Nov. 28, 2013, the entire contents of which are hereby incorporated herein by reference.

What is claimed is:

1. A method of fabricating an electromechanical transducer film, the method comprising:
    treating a surface of a first electrode to be liquid-repellent, the first electrode being formed on one surface of a substrate;
    irradiating the surface of the liquid-repellent first electrode with an energy ray to be lyophilic while moving an irradiation position to form a pair of first shapes and a plurality of second shapes, the plurality of second shapes being provided between the pair of first shapes;
    forming a pair of alignment marks by applying an application liquid to an area at least including the formed pair of first shapes by landing a plurality of droplets of the application liquid at regular intervals by an inkjet method;
    detecting a print position based on the formed pair of alignment marks; and
    forming the electromechanical transducer film by applying a sol-gel liquid to the area in accordance with the plurality of second shapes based on the detected print position, the sol-gel liquid being applied by the inkjet method, wherein
    the formed electromechanical transducer film is distinct and separate from the formed pair of alignment marks,
    each of the formed pair of first shapes has a plurality of sides, and
    a shortest side of each of the formed pair of first shapes is longer than a diameter of the at least one of the plurality of the landed droplets of the application liquid.

2. The method as claimed in claim 1, wherein
    the forming of the electromechanical transducer film is performed a plurality of times.

3. The method as claimed in claim 2, wherein
    the forming of the pair of alignment marks is performed before the forming of the electromechanical transducer film is performed at a first time.

4. The method as claimed in claim 1, wherein
    the pair of alignment marks is lyophilic, and a periphery of the pair of alignment marks is liquid-repellent.

5. The method as claimed in claim 1, wherein an area of one of the pair of the first shapes is greater than an area of at least one of the plurality of the landed droplets of the application liquid.

6. The method as claimed in claim 1, wherein a shape of each of the formed pair of alignment marks is different from a shape of the at least one of the plurality of the landed droplets of the application liquid.

7. The method as claimed in claim 1, wherein each of the formed pair of first shapes corresponds to a rectangular shape.

8. A method of fabricating an electromechanical transducer film, the method comprising:
    treating a surface of a first electrode to be liquid-repellent, the first electrode being formed on one surface of a substrate;
    irradiating the surface of the liquid-repellent first electrode with an energy ray to be lyophilic while moving an irradiation position to form a pair of first shapes and a plurality of second shapes, the plurality of second shapes being provided between the pair of first shapes;
    forming a pair of alignment marks by applying an application liquid to an area at least including the formed pair of first shapes by landing a plurality of droplets of the application liquid at regular intervals by an inkjet method;
    detecting a print position based on the formed pair of alignment marks; and
    forming the electromechanical transducer film by applying a sol-gel liquid to the area in accordance with the plurality of second shapes based on the detected print position, the sol-gel liquid being applied by the inkjet method, wherein
    the formed electromechanical transducer film is distinct and separate from the formed pair of alignment marks,
    the pair of alignment marks is liquid-repellent, and
    a periphery of the pair of alignment marks is lyophilic.

9. A method of fabricating an electromechanical transducer film, the method comprising:
    treating a surface of a first electrode to be liquid-repellent, the first electrode being formed on one surface of a substrate;
    irradiating the surface of the liquid-repellent first electrode with an energy ray to be lyophilic while moving an irradiation position to form a pair of first shapes and a plurality of second shapes, the plurality of second shapes being provided between the pair of first shapes;
    forming a pair of alignment marks by applying an application liquid to an area at least including the formed pair of first shapes by landing a plurality of droplets of the application liquid at regular intervals by an inkjet method;
    detecting a print position based on the formed pair of alignment marks; and
    forming the electromechanical transducer film by applying a sol-gel liquid to the area in accordance with the plurality of second shapes based on the detected print position, the sol-gel liquid being applied by the inkjet method, wherein
    the formed electromechanical transducer film is distinct and separate from the formed pair of alignment marks,
    each of the formed pair of first shapes corresponds to a rectangular shape, and
    a short side of each of the formed pair of first shapes is longer than a diameter of the at least one of the plurality of the landed droplets of the application liquid.

* * * * *